United States Patent
Nakata et al.

(10) Patent No.: US 6,495,394 B1
(45) Date of Patent: Dec. 17, 2002

(54) CHIP PACKAGE AND METHOD FOR MANUFACTURING THE SAME

(75) Inventors: Yoshikazu Nakata, Shiga (JP); Takeshi Kasai, Yamaguchi (JP)

(73) Assignee: Sumitomo Metal (SMI) Electronics Devices Inc., Yamaguchi (JP)

( * ) Notice: Subject to any disclaimer, the term of this patent is extended or adjusted under 35 U.S.C. 154(b) by 0 days.

(21) Appl. No.: 09/584,144

(22) Filed: May 31, 2000

Related U.S. Application Data

(62) Division of application No. 09/250,282, filed on Feb. 16, 1999, now Pat. No. 6,249,053.

(51) Int. Cl.$^7$ ............................................. H01L 21/44
(52) U.S. Cl. ..................... 438/107; 205/126; 216/13; 216/18; 216/41
(58) Field of Search ..................... 204/15; 430/314; 427/96; 156/661.1; 205/126; 216/13; 257/729

(56) References Cited

U.S. PATENT DOCUMENTS

| | | | | |
|---|---|---|---|---|
| 3,819,497 A | * | 6/1974 | Grunwald et al. | 204/15 |
| 4,217,182 A | * | 8/1980 | Cross | 204/15 |
| 4,804,615 A | * | 2/1989 | Larson et al. | 430/314 |
| 4,847,114 A | * | 7/1989 | Brasch et al. | 427/96 |
| 4,931,148 A | * | 6/1990 | Kukanskis et al. | 204/15 |
| 5,132,879 A | | 7/1992 | Chang et al. | 361/412 |
| 5,160,579 A | * | 11/1992 | Larson | 156/661.1 |
| 5,160,779 A | | 11/1992 | Sugihara | 428/209 |
| 5,252,195 A | * | 10/1993 | Kobayashi et al. | 205/126 |
| 5,689,091 A | | 11/1997 | Hanzehdoost et al. | 174/255 |
| 5,733,466 A | * | 3/1998 | Benebo et al. | 216/13 |
| 5,756,377 A | | 5/1998 | Ohsawa et al. | 438/111 |
| 5,877,553 A | | 3/1999 | Nakayama et al. | 257/708 |
| 5,901,436 A | | 5/1999 | Ohsawa et al. | 29/827 |
| 5,990,553 A | * | 11/1999 | Morita et al. | 257/729 |

\* cited by examiner

*Primary Examiner*—David Nelms
*Assistant Examiner*—Mai-Huong Tran
(74) *Attorney, Agent, or Firm*—Wenderoth, Lind & Ponack, L.L.P.

(57) ABSTRACT

In a chip package, when a Ni/Au layer is formed by electroless plating, there is no problem with density increasing of interconnections and the like, since leads for plating and tie bars are not formed. However, the adhesive strength of solder balls to ball pads is low, so that the adhesion tends to be unstable. In the present invention, no leads for plating are formed, while the adhesive strength of solder balls to ball pads is improved by electroplating the ball pads with a Ni/Au layer. In addition, an increase in the density of interconnections and an improvement of the electrical properties is also obtained. The Ni/Au layer is formed by electroplating on the base metal layer surface which is not covered with a DFR (Dry Film Resist) by applying an electric current to the base metal layer.

9 Claims, 24 Drawing Sheets

Fig. 2
Prior Art
(a)
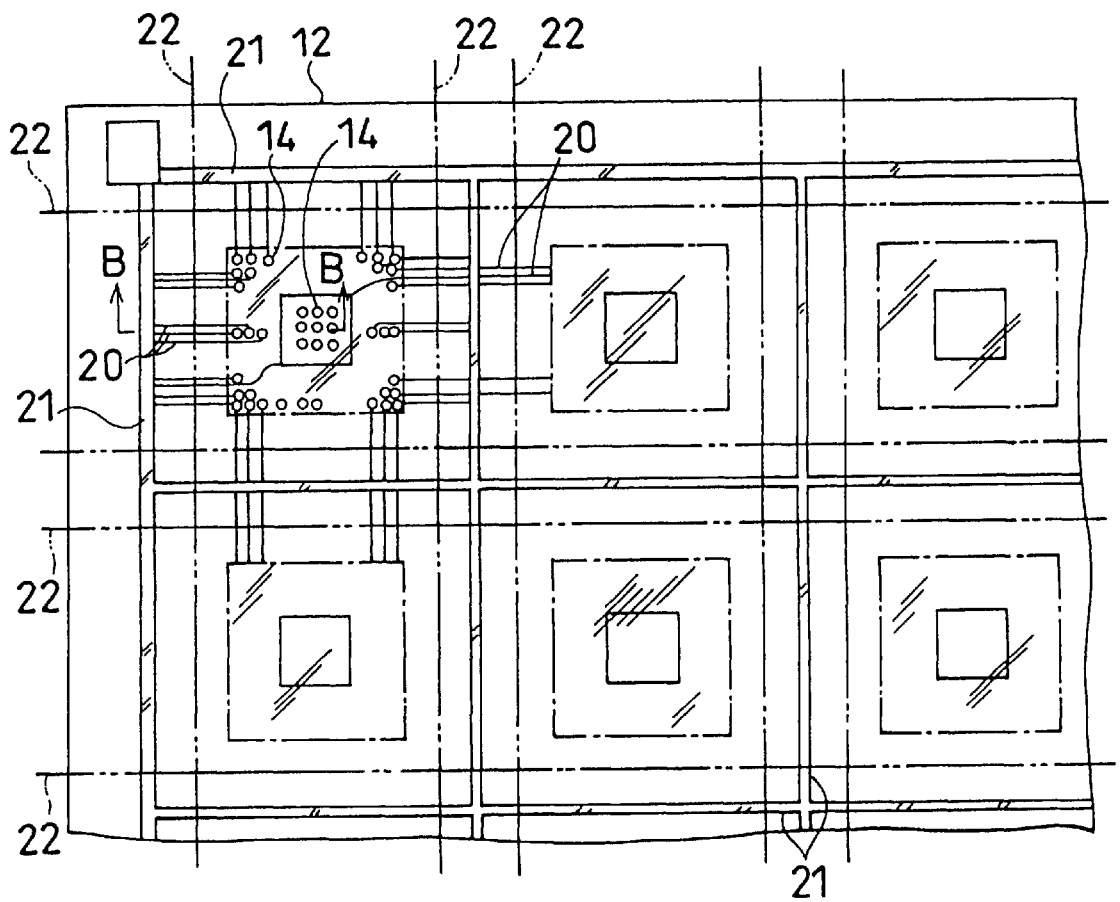
(b)
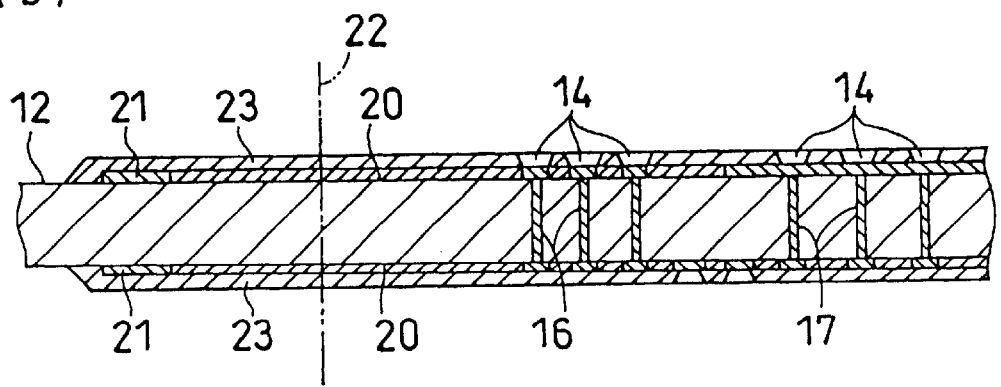

Fig.12
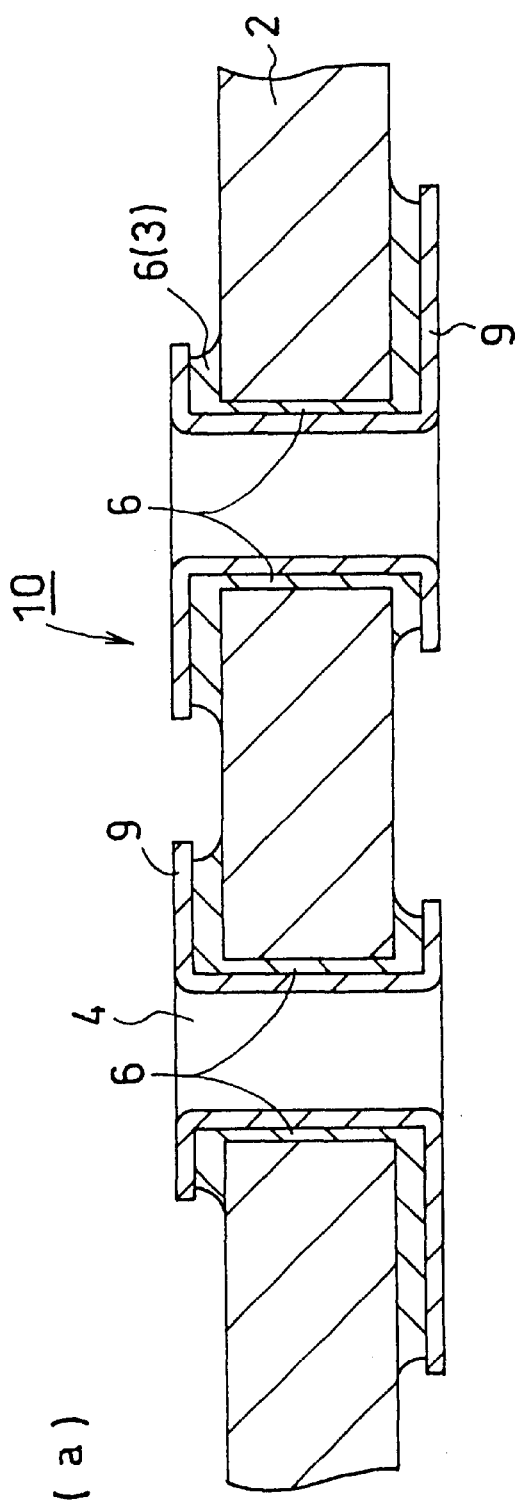
(a)
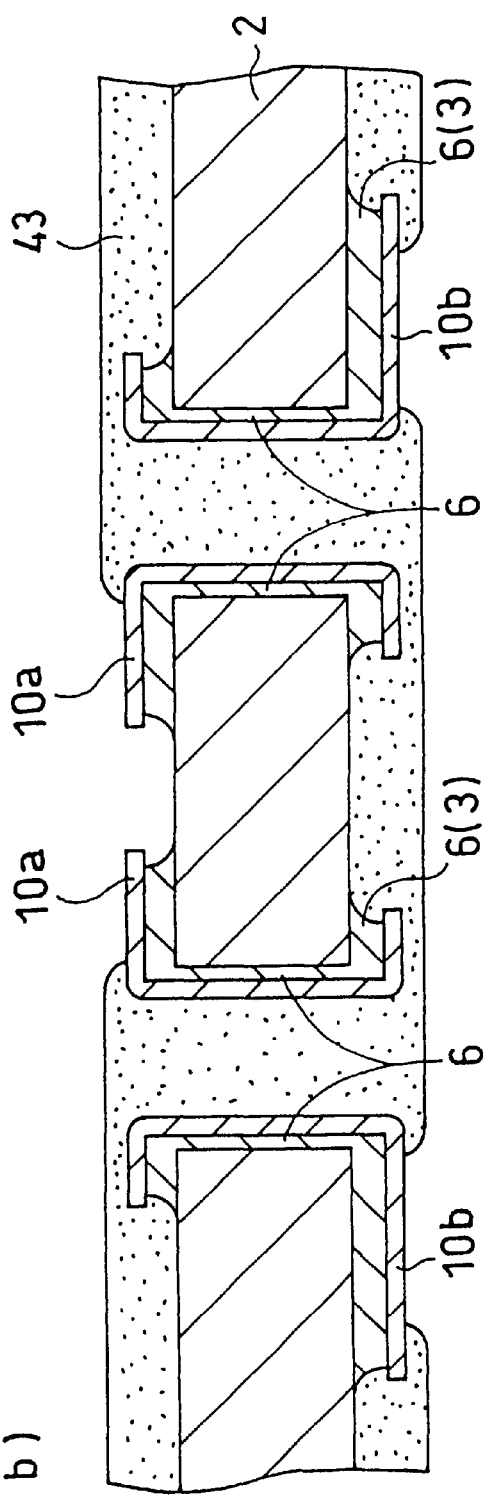
(b)

Fig.18
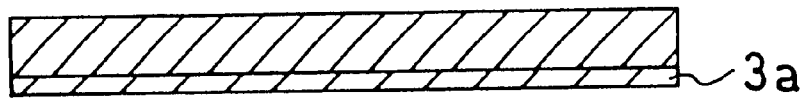
(a)
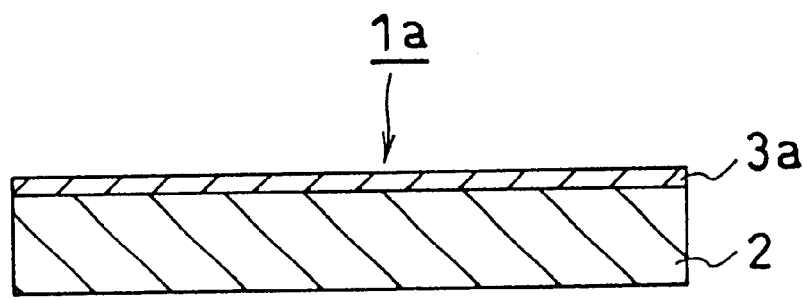
(b)
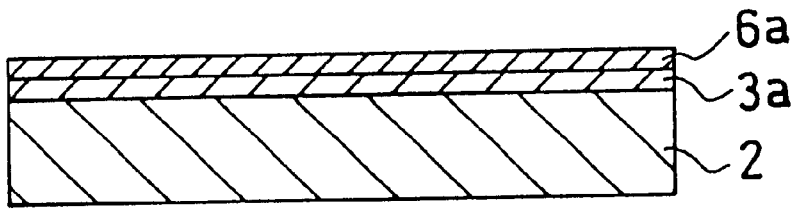
(c)
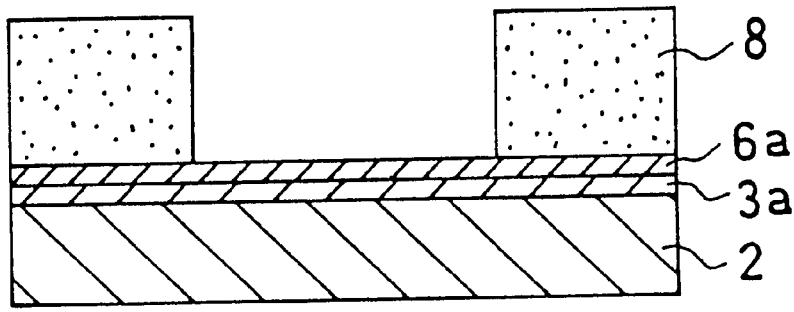
(d)

Fig. 20
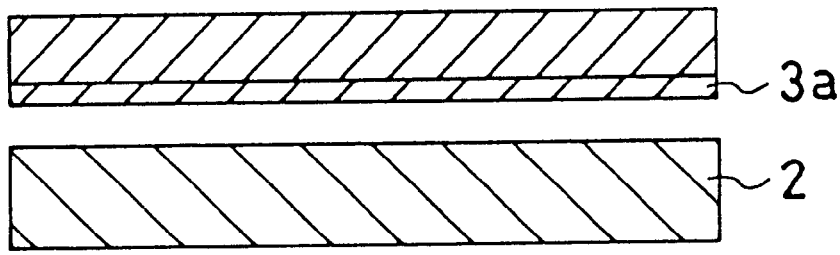
(a)
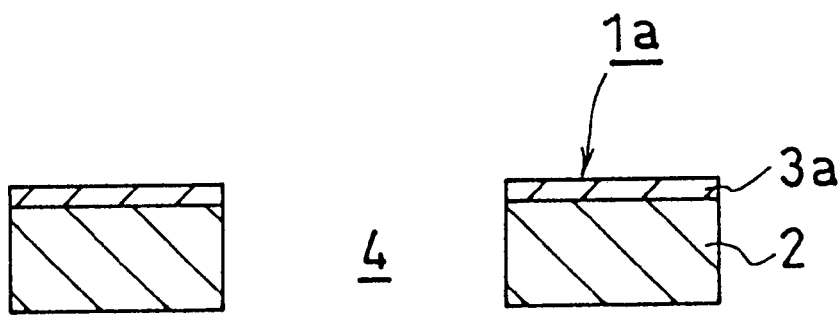
(b)
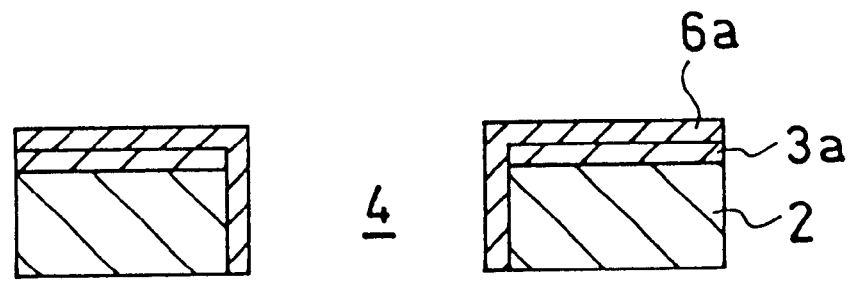
(c)
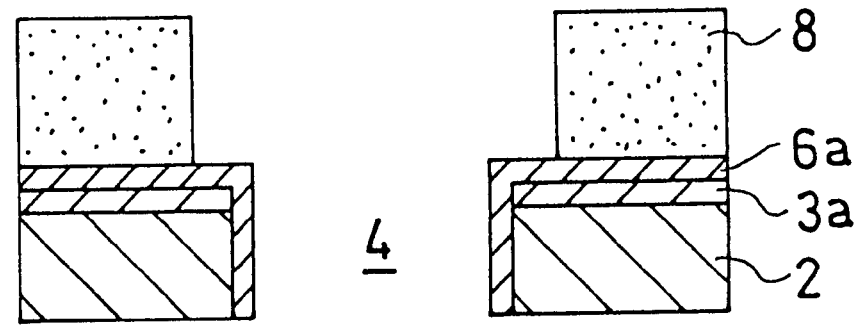
(d)

Fig. 22
(a)
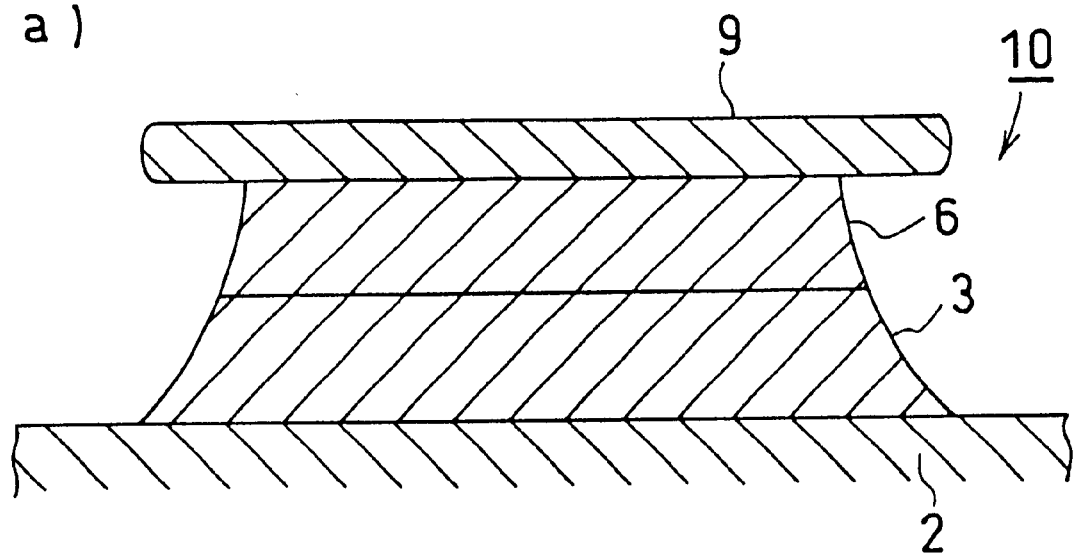
(b)
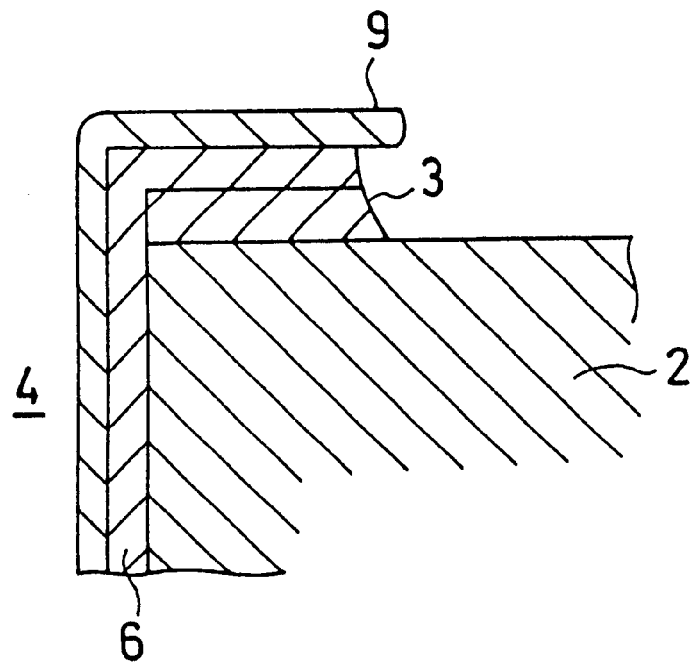

CHIP PACKAGE AND METHOD FOR MANUFACTURING THE SAME

This application is a divisional of Ser. No. 09/250,282, filed Feb. 16, 1999, now U.S. Pat. No. 6,249,053, issued Jun. 19, 2001.

BACKGROUND OF THE INVENTION

1. Field of the Invention

The present invention relates to a chip package and a method for manufacturing the same more particularly, to a chip package of the type that has an interconnection pattern and ball pads formed by etching a metal layer on one side or both sides of a resin substrate, which includes a package, such as a BGA package, or a flip chip package and is mainly used as a package, for mounting a chip such as a LSI chip, and a method for manufacturing the same.

2. Description of the Relevant Art

Recently, a BGA (Ball Grid Array), a flip chip package and the like, which can be made to have more terminals have attracted attention since a semiconductor apparatus is requested to have a higher density and a higher speed. The BGA is most suitable for packaging of ICs, such as a microprocessor and an ASIC, which are required to have more terminals, and has the following characteristics.

(a) Since balls are arranged in a plane, it is possible to have more terminals than packaging technologies using a lead frame, such as a QFP (Quad Flat Package), and it is also possible to have still more terminals than a PGA (Pin Grid Array).

(b) Since a BGA has a larger lead pitch than the QFP, the precision of a mounter or the like is not always required to be high, and so the packaging yield is improved.

(c) The cost is relatively low.

(d) The heat dissipation property is excellent, so that the impedance can be low.

Untill recently, attention had been paid to a ceramic BGA among BGAs from the viewpoint of reliability, but the priority is moving to plastic array packages from the viewpoint of cost reduction. In the plastic array packages of this kind, there are PBGA (Plastic BGA), TBGA (Tape BGA), μ-BGA, CSP (Chip Size Package, Chip Scale Package) and the like in a broader sense.

An example of the PBGA is shown in FIG. 1. On the IC chip 11 mounting surface of a resin substrate 12, an interconnection pattern 13 is formed, while on the other surface thereof, a large number of ball pads 14 are formed. These ball pads 14 and the interconnection pattern 13 are connected through through holes 16 for interconnection. The bottom surface of the IC chip 11 is connected to the ball pads 14 through through holes 17 for heat dissipation. On the ball pads 14, solder balls 15 are deposited. The interconnection pattern 13 is connected to pads formed on the IC chip 11 (not shown) through bonding pads 13a and wire bonders 18. The portion which includes the IC chip 11, the wire bonders 18, and the majority of the interconnection pattern 13 is covered with a mold resin 19.

Ordinarily, the bonding pads 13a and the ball pads 14 are Ni/Au plated (not shown) in order to improve the bonding property and the deposition property of the solder balls 15, and for that purpose the interconnection for electroplating is formed as shown in FIG. 2, for example. Each of the bonding pads 13a and ball pads 14 is connected to a tie bar 21 through a lead for plating 20. After the plating is finished, each device is made by cutting on cutting lines 22. The portion which need not be plated is previously covered with a solder mask 23 before the plating treatment.

An example of a BGA with a heat spreader is shown in FIGS. 3 and 4. BT (Bismaleimide Triazine) is used for forming a tape-shaped thin resin substrate 32. Since the BT resin has almost the same thermal transformation temperature (300° C.) as a polyimide resin and has better adhesiveness to a copper foil and workability than the polyimide resin, it is used widely for LSI packages. On the bottom surface of the resin substrate 32, an interconnection pattern (not shown) and ball pads 34 are formed by etching a copper foil. On the ball pads 34, solder balls 15 are deposited. Onto the top surface of the resin substrate 32, a Cu ring 33 having a cavity 35 to accomodate an IC chip 11 is adhered. Onto the top surface of the Cu ring 33, a Cu heat spreader 38 is further adhered through an adhesive sheet 38a. In the center portion of the resin substrate 32, a dam 36 is formed so as to surround the cavity 35. After connecting wire bonders 18, an injection mold resin 39 is injected into the cavity 35 to be solidified. The ball pads 34 and bonding pads (not shown) comprise a Cu layer 34a and a Ni/Au layer 34b as shown in FIG. 4. A solder mask 43 is formed around the Ni/Au layer 34b.

In the BGA with a heat spreader of the type shown in FIG. 3, since it is difficult to arrange the leads for plating 20 shown in FIG. 2 from the viewpoint of space, the Ni/Au layer 34b is formed by electroless plating. The leads for plating 20 and tie bars 21 shown in FIG. 2 are not formed during the manufacturing process.

An example of a conventional flip chip package wherein a semiconductor component is mounted by flip chip bonding is shown in FIGS. 5 and 6. On the chip 11 mounting surface of a resin substrate 12, an interconnection pattern 13 and ball pads 14a are formed, while on the other surface thereof, a large number of ball pads 14b are formed. These ball pads 14b and the interconnection pattern 13 are connected through through holes 16 for interconnection. The ball pads 14a under the chip 11 are connected to the ball pads 14b through through holes 17 for heat dissipation. On the ball pads 14b, solder balls 15 are deposited. The interconnection pattern 13 is connected to the chip 11 through the solder balls 15 deposited on the ball pads 14a. The space between the chip 11 and the resin substrate 12 is charged with a mold resin 19. On the portion of the interconnection pattern 13 except the ball pads 14a and 14b, a solder mask 23 is formed. The ball pads 14a and 14b comprise a Cu layer 34a and a Ni/Au layer 34b as shown in FIG. 6 and the solder mask 23 is formed around the Ni/Au layer 34b.

The Ni/Au layer 34b in the flip chip package shown in FIGS. 5 and 6 is formed not by electroplating but by electroless plating. This is because flip chip packages tend to have high-density interconnections, and so it is difficult to form leads for electroplating between the high-density interconnections.

In the PBGA of the type shown in FIGS. 1 and 2, a large number of leads for plating 20 connected to each bonding pad 13a or ball pad 14 and tie bars 21 must be formed for electroplating, which prevents the interconnection pattern 13 and ball pads 14 from having a higher density. The leads for plating 20 inside the cutting lines 22 are left even after plating, leading to a possibility that they become a source of reflected noise, which adversely affects the electrical properties.

On the other hand, since the electroless plating is conducted in the BGA with a heat spreader of the type shown in FIGS. 3 and 4, the leads for plating 20 and the tie bars 21 need not be formed, and so there is no problem with density increasing of the interconnections and the like. However, the adhesive strength of the solder balls 15 to the ball pads 34 is low, so that the adhesion tends to be unstable.

Since the electroless plating is conducted in the flip chip package of the type shown in FIGS. 5 and 6 in the same manner as in the BGA with a heat spreader of the type shown in FIGS. 3 and 4, the leads for plating 20 and the tie bars 21 need not be formed and so there is no problem with increasing density of the interconnections and the like. However, the adhesive strength of the solder balls 15 to the ball pads 14a and 14b is low, so that the adhesion tends to be unstable.

SUMMARY OF THE INVENTION

The present invention was developed in order to solve the above problems. It is an object of the present invention to provide a chip package wherein leads for plating need not be formed so as to enable the realization of higher density and an improvement of electrical properties while the plating is conducted by electroplating so that the adhesive strength of solder balls to pads is secured, and a method for manufacturing the same.

In order to achieve the above object, a chip package (1), according to the present invention has an interconnection pattern and ball pads formed by etching a metal layer on one side or both sides of a resin substrate, and is characterized by the surface of the interconnection pattern and ball pads which is coated with Ni and Au films by electroplating, and no leads for electroplating are formed since an electric current is applied to the metal layer during electroplating.

In the chip package (1), since an electric current is applied to the metal layer during electroplating, the leads for electroplating usually required are not needed. As a result, it is possible to inhibit the leads from preventing the density increasing and from deteriorating the electrical properties. Since the plating for forming the Ni and Au films is conducted by electroplating, a sufficient value of adhesive strength of the solder balls can be obtained.

A chip package (2) according to the present invention is characterized by the metal layer which includes a copper foil and an electroless copper plating layer in the chip package (1).

In the chip package (2), an adequate thickness of the metal layer can be secured, the copper foil has an excellent adhesiveness to the resin substrate and strength, and a large current can passed through the copper foil during the formation of the Ni and Au films by electroplating.

A chip package (3) according to the present invention is characterized by the metal layer which includes an electroless copper plating layer in the chip package (1).

In the chip package (3), the metal layer comprising the electroless copper plating layer can be formed to be thin, i.e., micron or so. As a result, the subsequent etching in patterning becomes easy and the quantity of overhang during etching is as small as possible, and so the interconnection pattern can easily have a higher density.

A chip package (4) according to the present invention is characterized by through holes formed in the resin substrate, having side walls which are coated with Ni and Au films by electroplating in one of the chip packages (1)–(3).

Conventionally, only Cu plating is conducted on the side walls of the through holes, not Ni/Au plating. But in the chip package (4), since the Ni/Au plating film is formed by electroplating, not only the surface of the interconnection pattern and ball pads but also the side walls of the through holes, the reliability of the chip package can be improved.

A method for manufacturing a chip package (1) according to the present invention includes the steps of:
  forming a plating resist pattern on the surface of a metal layer formed on one side or both sides of a resin substrate;
  applying an electric current to the metal layer to form Ni and Au films by electroplating on the metal layer surface which is not covered with the plating resist pattern; and
  removing the plating resist pattern to etch the metal layer using the Ni/Au film as an etching mask.

In the method for manufacturing a chip package (1), since the Ni/Au film is formed by electroplating on the portion of the metal layer surface which is not covered with the plating resist pattern, then the metal layer used for the passage of electric current is etched using the Ni/Au film as an etching mask. Therefore the interconnection pattern and ball pads made of the metal layer/Ni/Au film can be formed without forming leads for electroplating only if the metal layer surface except a portion to be an interconnection pattern and ball pads is covered with the plating resist pattern. Furthermore, since the Ni/Au film is formed by electroplating, it has sufficient adhesive strength to the solder balls.

A method for manufacturing a chip package (2) according to the present invention is characterized by the metal layer comprising a copper foil, an electroless copper plating layer, and an electrolytic copper plating layer in the method for manufacturing a chip package (1).

In the method for manufacturing a chip package (2), the electroless copper plating layer and electrolytic copper plating layer can be formed in the through holes formed in the resin substrate before forming the Ni/Au film by electroplating, and the Ni/Au film can be also formed in the through holes by electroplating. As a result, the reliability of the chip package can be improved.

A method for manufacturing a chip package (3) according to the present invention is characterized by the metal layer comprising an electroless copper plating layer, or a copper foil and an electroless copper plating layer in the method for manufacturing a chip package (1).

In the method for manufacturing a chip package (3), by forming the electroless copper plating layer after forming the through holes in the resin substrate, the metal layer for the interconnection pattern and ball pads and the metal layer for the through holes can be formed at the same time, leading to the simplification of the chip package manufacturing process. The electroless copper plating layer can be formed to be thin, i.e., 1 micron or so. As a result, the subsequent etching of the electroless copper plating layer as a metal layer becomes easy. The quantity of overhang during the etching of the electroless copper plating layer can be made as small as possible, therefore a high-density interconnection pattern can be easily achieved. When the metal layer comprises a copper foil and an electroless copper plating layer, the adhesive strength of the metal layer to the resin substrate can be increased in addition to the above effects.

A method for manufacturing a chip package (4) according to the present invention is characterized by including the step of conducting electroless plating and electroplating treatment of copper on the side walls of through holes after forming the through holes in the resin substrate, in one of the methods for manufacturing a chip package (1)–(3).

In the method for manufacturing a chip package (4), since a plating film of Cu which is a good conductor is formed on the side walls of the through holes before the Ni/Au plating treatment by electroplating, the Ni/Au plating film can be also formed on the side walls of the through holes by electroplating. As a result, the reliability of the chip package can be improved.

A method for manufacturing a chip package (5) according to the present invention is characterized by using a dry film resist having a principal constituent of an acrylic resin for forming the plating resist pattern in one of the methods for manufacturing a chip package (1)–(3).

The dry film resist having a principal constituent of an acrylic resin has high resistance to the Cu/Ni/Au plating solution and is favorably stripped by a release solution so that no residue of stripping is caused. Therefore, in the method for manufacturing a chip package (5), a precise interconnection pattern and ball pads can be formed, therefore the occurrence rate of shorting can be easily reduced.

A method for manufacturing a chip package (6) according to the present invention is characterized by using a liquid resist having a principal constituent of an acrylic resin for forming the plating resist pattern in one of the methods for manufacturing a chip package (1)–(3).

The liquid resist having a principal constituent of an acrylic resin has excellent adhesiveness to the metal layer so that the pattern formation is precisely conducted, and has high resistance to the Cu/Ni/Au plating solution and is favorably stripped by a release solution so that no residue of stripping is caused. Therefore, in the method for manufacturing a chip package (6), a fine interconnection pattern and ball pads can be precisely formed, therefore the occurrence rate of shorting can be easily reduced.

A method for manufacturing a chip package (7) according to the present invention is characterized by conducting cleaning treatment on the metal layer surface before forming the plating resist pattern in the method for manufacturing a chip package (5).

By conducting the cleaning treatment, the adhesiveness of the plating resist pattern to the metal layer surface is improved. As a result, the plating solution is prevented from penetrating under the plating resist pattern during electroplating so that the occurrence of shorting in the interconnection pattern can be inhibited.

A method for manufacturing a chip package (8) according to the present invention is characterized by conducting bake treatment on a plating resist and/or plating resist pattern before forming Ni and Au films by electroplating in one of the methods for manufacturing a chip package (1)–(3).

By the bake treatment, the optical setting reaction and/or thermosetting reaction of the plating resist is accelerated so that the adhesive strength thereof to the base metal layer is higher.

A method for manufacturing a chip package (9) according to the present invention is characterized by using an alkaline solution having a principal constituent of copper ammine complex or tetraamminecopper (II) chloride as an etchant of the metal layer in the method for manufacturing a chip package (2).

The alkaline solution having a principal constituent of a copper amine complex or a tetraamminecopper (II) chloride can etch only the Cu layer efficiently, without dissolving the Ni and Au films. Therefore, the metal layer can be etched efficiently using the electroplating film of Ni/Au as an etching mask.

A method for manufacturing a chip package (10) according to the present invention is characterized by using a soft etching solution having a principal constituent of a soda persulfate or mixture of hydrogen peroxide and sulfuric acid as an etchant of the metal layer, in the method for manufacturing a chip package (3).

The soft etching solution having a principal constituent of a soda persulfate or mixture of hydrogen peroxide and sulfuric acid can etch the Cu layer efficiently without dissolving the Au film. In addition, the soft etching solution is milder than the alkaline solution having a principal constituent of copper ammine complex or tetraamminecopper (II) chloride. Therefore, when the metal layer is an electroless copper plating layer, or a copper foil and an electroless copper plating layer with the electroplating film of Ni/Au used as an etching mask, the electroless copper plating layer, or the copper foil and electroless copper plating layer can be precisely efficiently with almost no overhang thereon.

BRIEF DESCRIPTION OF THE DRAWINGS

FIG. 2(a) is a top view showing a conventional BT substrate on which leads for plating are formed, and FIG. 2(b) is a sectional view thereof;

FIGS. 12(a) and 12(b) are sectional views showing part of the manufacturing process of a flip chip package according to the embodiment (2) of the present invention;

FIGS. 18(a)–(d) are sectional views showing part of the manufacturing process of a flip chip package according to the embodiment (4) of the present invention;

FIGS. 20(a)–(d) are sectional views showing part of the manufacturing process of a flip chip package according to the embodiment (4) of the present invention;

FIGS. 22(a) and 22(b) are enlarged sectional views showing a Ni/Au layer formed on an interconnection pattern according to an example;

DETAILED DESCRIPTION OF THE PREFERRED EMBODIMENTS

The preferred embodiments of the chip package and the method for manufacturing the same according to the present invention are described below by reference to the Figures.

Figure 7:
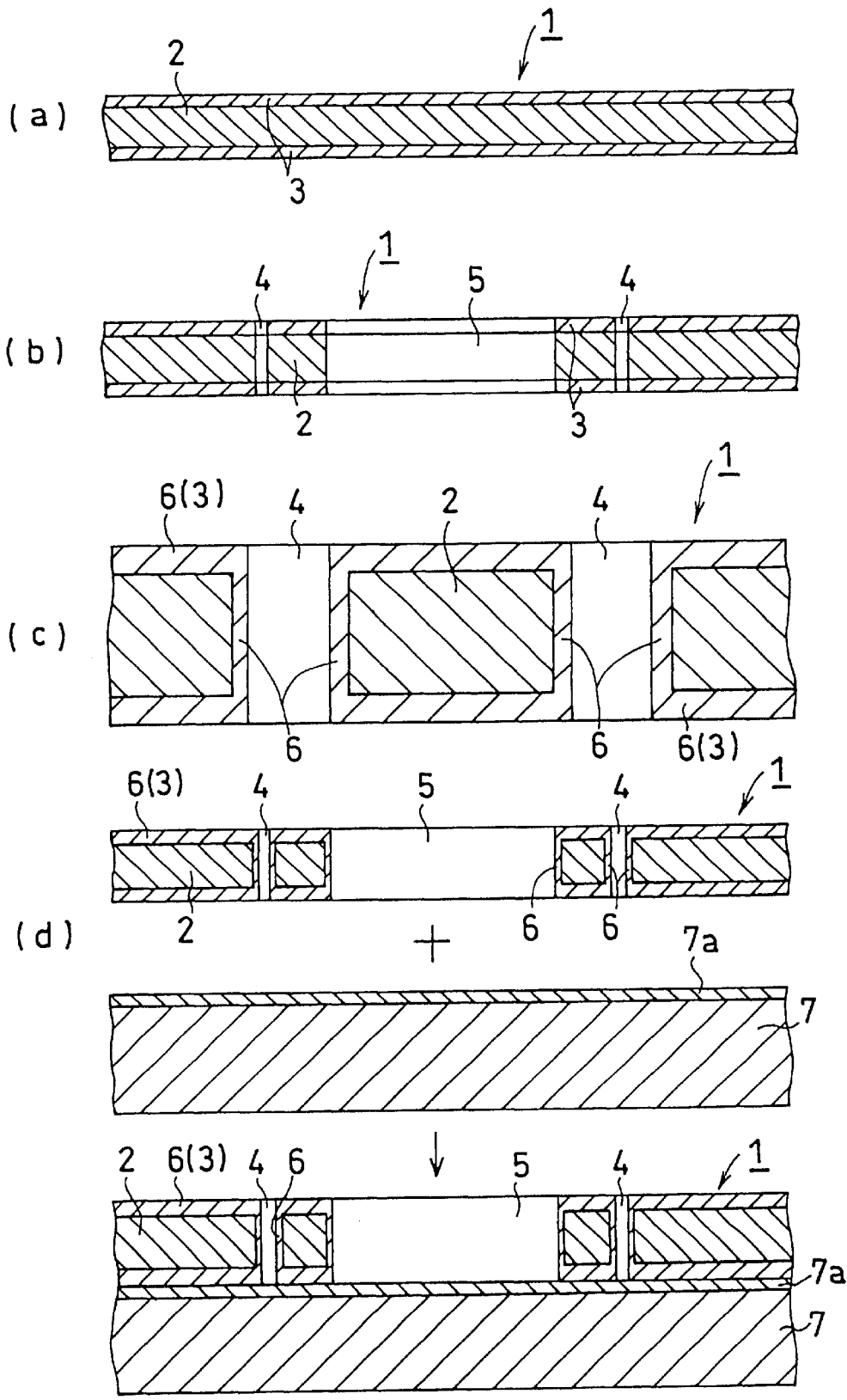
FIGS. 7(a)–(d) are sectional views showing part of the manufacturing process of a BGA package according to the embodiment (1) of the present invention.

FIG. 7 is a diagrammatic sectional view showing part of the manufacturing process of a BGA package with a heat spreader according to the embodiment (1). In FIG. 7, reference numeral 1 represents a copper-covered laminate. The copper-covered laminate 1 comprises a resin substrate 2 and copper foils 3 adhered onto both main surfaces thereof (FIG. 7(a)). Punching of through holes 4 and a cavity 5 is conducted on the copper-covered laminate 1 (FIG. 7(b)). Panel plating treatment by electroless and electrolytic copper platings is conducted on the copper-covered laminate 1 in which the through holes 4 and the cavity 5 are formed. The copper foils 3 adhered onto the top and bottom surfaces of the resin substrate 2 are electrically connected through the through holes 4 (Cu layers 6 by electroless and electrolytic copper platings) (FIG. 7(c)). The copper-covered laminate 1 is adhered to a Cu plate 7 through an adhesive sheet 7a (FIG. 7(d)).

Cleaning treatment is conducted on the top surface of the copper foil 3 (upper side in the figure). The cleaning treatment is conducted in order to increase the adhesiveness of a DFR (Dry Film Resist) 8 which is to be adhered thereto later. In more concrete terms, jet scrubbing (mechanical polishing by buffing), acid cleaning with sulfuric acid, and jet scrubbing or the like are conducted. Onto the copper foil 3 on which the cleaning treatment is conducted, the DFR (Dry Film Resist) 8 having a principal constituent of acrylic resin is adhered. Exposure treatment wherein the inverse pattern of the interconnection pattern is developed is conducted on the DFR 8, and PEB (Post Exposure Bake) treatment is conducted before developing in order to improve the adhesive strength by accelerating the optical setting reaction through the exposure. The DFR 8 is developed so that the DFR 8 of the inverse pattern is left, and post bake treatment is conducted in order to improve the adhesive strength by accelerating the thermosetting reaction (FIG. 8(a)).

In order to form a Ni/Au layer 9 on the surface of the copper foil 3 and panel plating layer by electroless and electrolytic copper platings which is not covered with the DFR 8, the laminated body of the copper-covered laminate 1 and the Cu plate 7 is dipped into a plating solution and applying an electric current thereto, electroplating is conducted (FIG. 8(b)). After rinsing the plating solution sufficiently, the laminated body is dipped into an about 3% NaOH aqueous solution of 50° C. in order to strip and remove the DFR 8. After removing the DFR 8 (FIG. 8(c)), etching is conducted on the copper foil 3 and panel plating layer by electroless and electrolytic copper platings using the formed Ni/Au layer 9 as a mask. As an etching solution, a solution which etches only the copper foil 3 and panel plating layer by electroless and electrolytic copper platings without etching the Ni/Au layer 9 is needed. An alkaline solution having a principal constituent of copper ammine complex or tetramminecopper (II) chloride and the like can be used. By the etching treatment, an interconnection pattern 10 including a pad portion wherein the electroplating film of the Ni/Au layer 9 is formed on the Cu interconnection is formed (FIG. 8(d)).

A solder mask 43 is formed on a portion of the interconnection pattern 10 except the bonding pads and ball pads 34 (FIG. 2) (FIG. 9(a)). A heat spreader 38 is further laminated on the laminated body of the copper-covered laminate 1 and the Cu plate 7 through an adhesive sheet 7b (FIGS. 9(b) and 9(c)).

Figure 1:
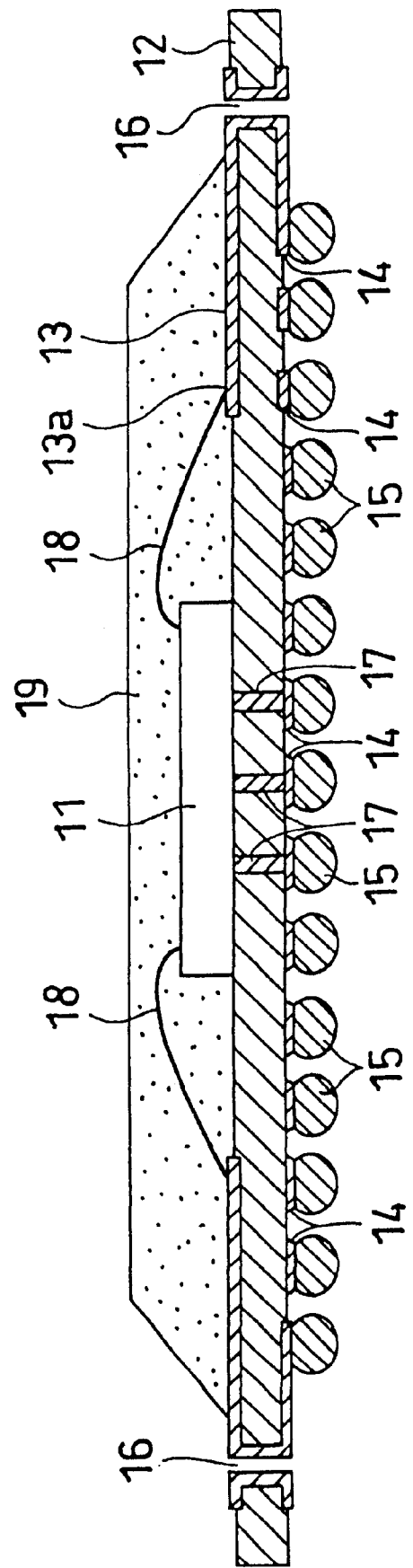
FIG. 1 is a sectional view showing an example of a conventional PBGA.
Figure 3:
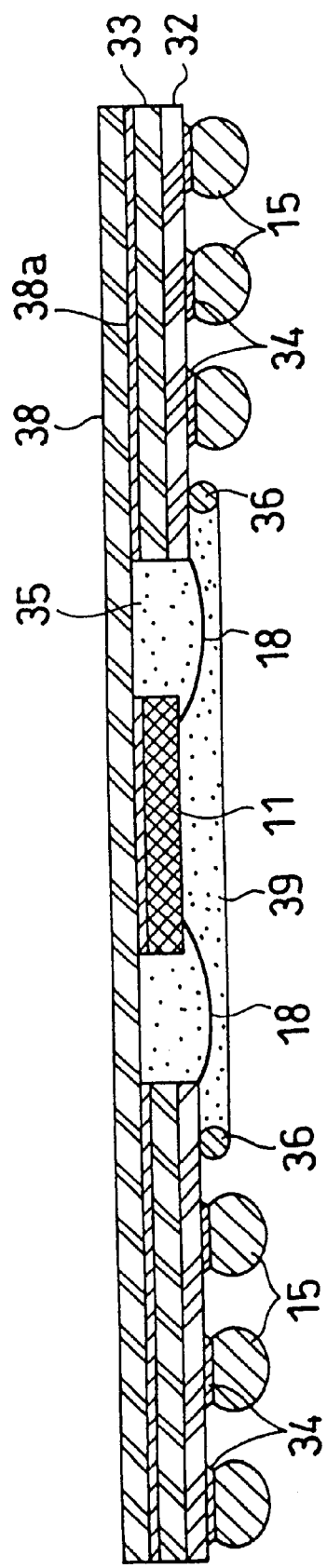
FIG. 3 is a sectional view showing an example of a conventional two-layer BGA with a heat spreader.
Figure 4:
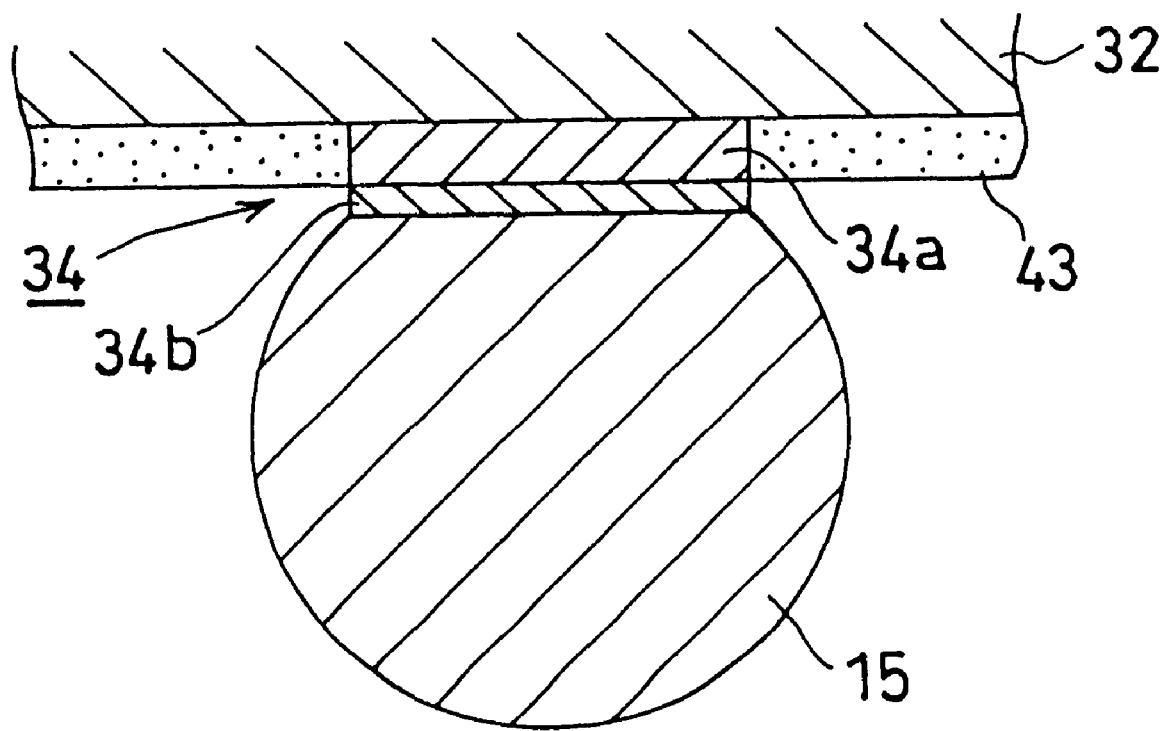
FIG. 4 is an enlarged sectional view showing a ball pad and its periphery.
Figure 5:
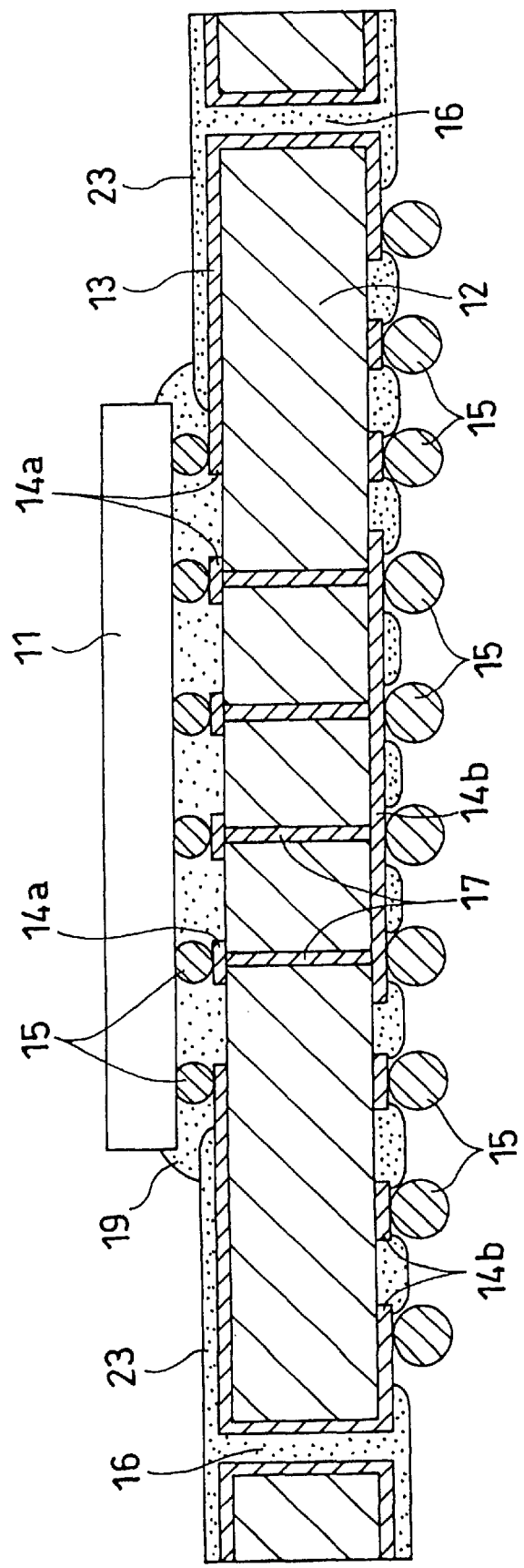
FIG. 5 is a sectional view showing an example of a conventional flip chip package.
Figure 6:
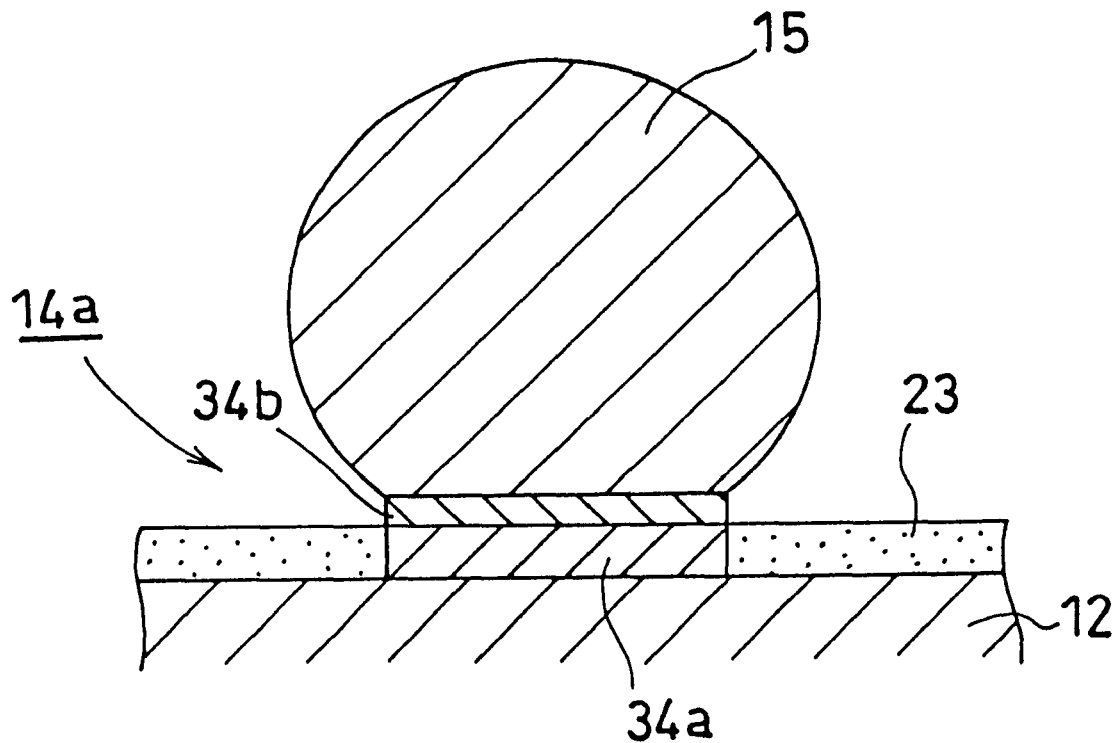
FIG. 6 is an enlarged sectional view showing a ball pad and its periphery.

According to the embodiment (1), the copper foil 3 and panel plating layer by electroless and electrolytic copper platings themselves function as conventional leads for plating 20 (FIG. 2), so that the Ni/Au layer 9 can be formed by electroplating on the interconnection pattern 10 without forming the leads for plating 20. As a result, it becomes easy to make the interconnection pattern 10 have a higher density, and there is no reflection caused by the partially remaining leads for plating 20, so that the electrical properties can be improved. Furthermore, since the Ni/Au layer 9 is formed by electroplating, a sufficiently large value of adhesive strength of wire bonding and solder balls 15 (FIG. 3) can be obtained. Since the Ni/Au layer 9 is also formed by electroplating on the side walls of the through holes 4, the reliability of the electrical connection through the through holes 4 can be improved.

The DFR 8 having a principal constituent of acrylic resin has high resistance to the plating solution used in the formation of the Ni/Au layer 9. It is favorably stripped by a release soultion such as a NaOH aqueous solution so that a residue of stripping is not caused. Therefore, it is easy to form the interconnection pattern 10 precisely, and so shorting between interconnections is not easily caused. Since the adhesiveness of the DFR 8 to the panel plating layer by electroless and electrolytic copper platings can be made higher by the cleaning and bake treatment, the penetration of the plating solution under the DFR 8 can be more certainly prevented.

Since the alkaline solution having a principal constituent of copper ammine complex or tetraamminecopper (II) chloride is used as an etchant of the copper foil 3 and panel plating layer by electroless and electrolytic copper platings, only the copper foil 3 and panel plating layer by electroless and electrolytic copper platings can be etched efficiently without dissolving the Ni/Au layer 9.

In the above embodiment (1), a two-layer construction wherein the copper foils 3 are adhered to both main surfaces of the resin substrate 2 is described as an example, but in another embodiment, a four-layer construction wherein two copper-covered laminates 1 are laminated is also available. Furthermore, a BGA construction having a usual PBGA construction without a heat spreader is also available as a matter of course.

Figure 10:
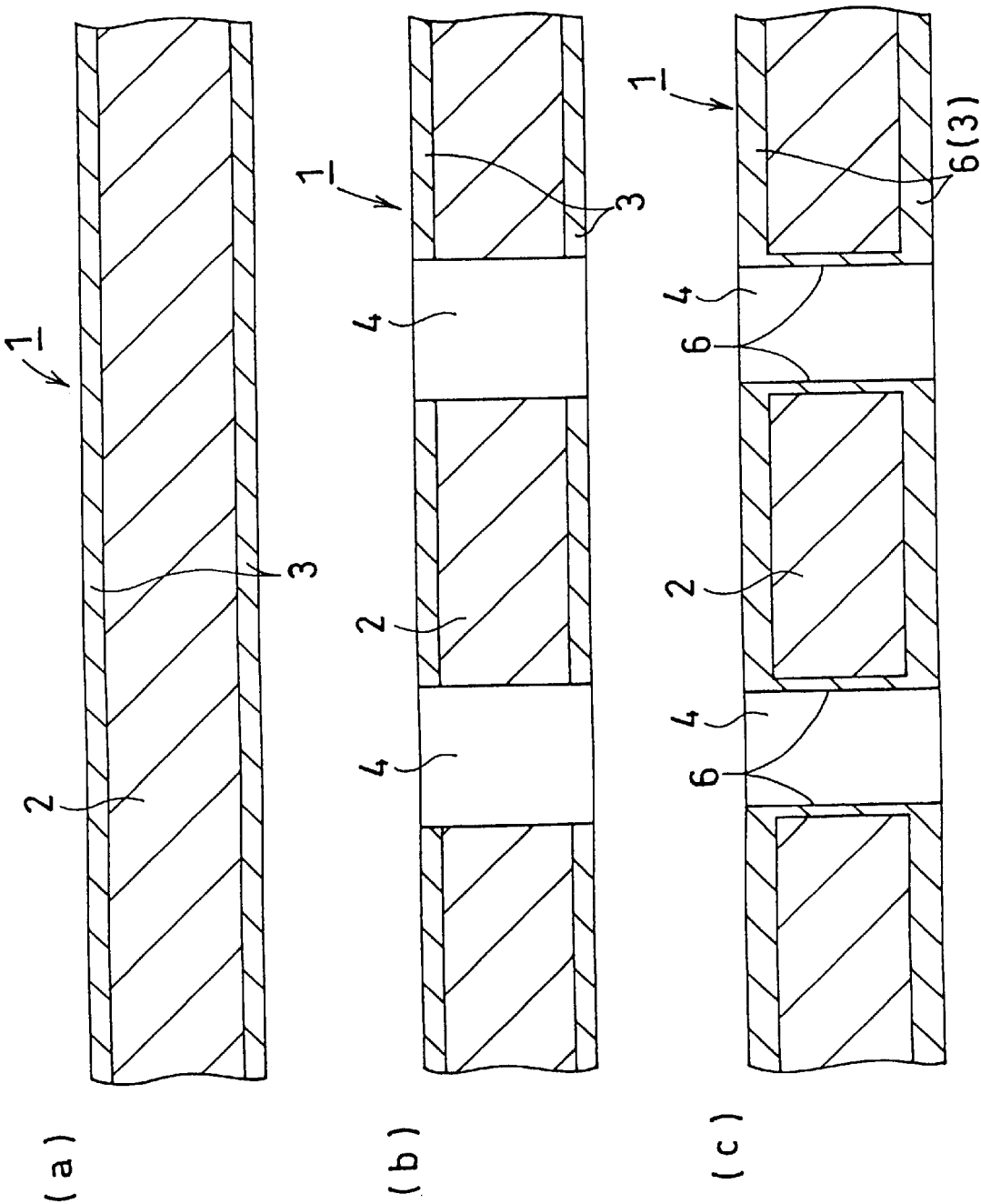
FIGS. 10(a)–(c) are sectional views showing part of the manufacturing process of a flip chip package according to the embodiment (2) of the present invention.
Figure 11:
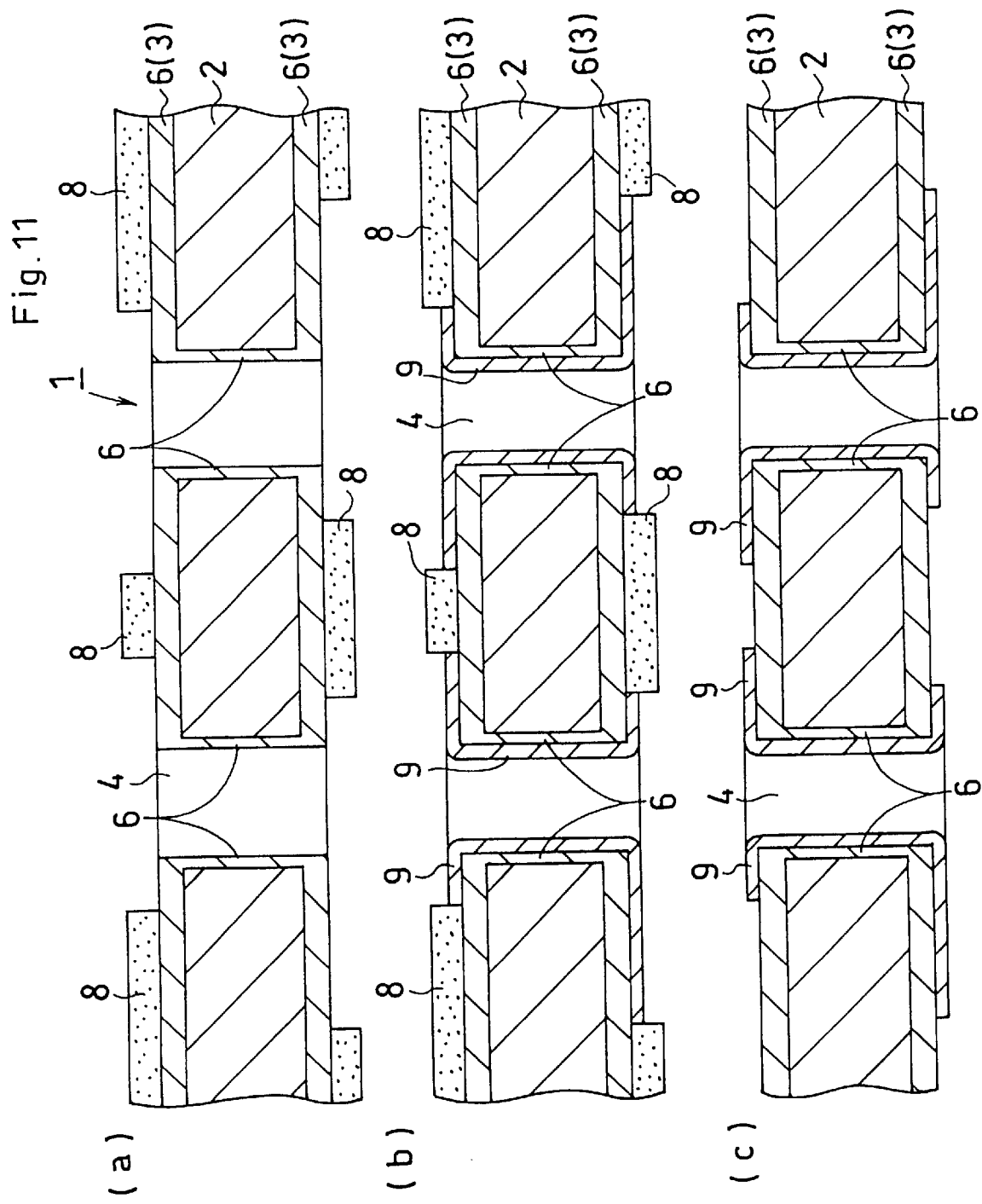
FIGS. 11(a)–(c) are sectional views showing part of the manufacturing process of a flip chip package according to the embodiment (2) of the present invention.

FIGS. 10–12 are diagrammatic sectional views showing part of the manufacturing process of a flip chip package according to the embodiment (2), and in the figure, reference numeral 1 represents a copper-covered laminate. The copper-covered laminate 1 comprises a resin substrate 2 and copper foils 3 adhered onto both main surfaces thereof (FIG.

10(*a*)). Punching of through holes 4 is conducted on the copper-covered laminate 1 (FIG. 10(*b*)). Panel plating treatment by electroless and electrolytic copper platings is conducted on the copper-covered laminate 1 in which the through holes 4 are formed, and the copper foils 3 adhered onto the top and bottom surfaces of the resin substrate 2 are electrically connected through the through holes 4 (Cu layers 6 by electroless and electrolytic copper platings) (FIG. 10(*c*)).

Cleaning treatment is conducted on the surfaces of the Cu layers 6 of panel plating by electroless and electrolytic copper platings. The cleaning treatment is conducted in order to increase the adhesiveness of a DFR 8 which is to be adhered thereto later, and in more concrete terms, jet scrubbing (mechanical polishing by buffing), acid cleaning with sulfuric acid, and jet scrubbing or the like are conducted. Onto the Cu layers 6 of panel plating by electroless and electrolytic copper platings on which the cleaning treatment is conducted, the DFRs 8 having a principal constituent of acrylic resin are adhered. Exposure treatment wherein the inverse pattern of the interconnection pattern is developed is conducted on the DFRs 8, and PEB (Post Exposure Bake) treatment is conducted before developing in order to improve the adhesive strength by accelerating the optical setting reaction through the exposure. The DFRs 8 are developed so that the DFRs 8 of the inverse pattern are left, and post bake treatment is conducted in order to improve the adhesive strength by accelerating the thermosetting reaction (FIG. 11(*a*)).

In order to form Ni/Au layers 9 on the surfaces of the Cu layers 6 of panel plating by electroless and electrolytic copper platings which are not covered with the DFRs 8, the copper-covered laminate 1 is dipped into a plating solution, an electric current is applied thereto, and electroplating is conducted (FIG. 11(*b*)). After rinsing the plating solution sufficiently, the laminate is dipped into an about 3% NaOH solution of 50° C. in order to strip and remove the DFRs 8. After removing the DFRs 8 (FIG. 11(*c*)), etching is conducted on the copper foils 3 and Cu layers 6 of panel plating by electroless and electrolytic copper platings using the formed Ni/Au layers 9 as a mask. As an etching solution, a solution which etches only the copper foil 3 and Cu layer 6 of panel plating by electroless and electrolytic copper platings without etching the Ni/Au layer 9 is needed, and an alkaline solution having a principal constituent of copper ammine complex or tetraamminecopper (II) chloride or the like can be exemplified. By the etching treatment, an interconnection pattern 10 including a pad portion wherein the electroplating film of the Ni/Au layer 9 is formed on the Cu interconnections is formed (FIG. 12(*a*)).

A solder mask 43 is formed on the portion of the interconnection pattern 10 except ball pads 10*a* for semiconductor component connection and ball pads 10*b* for mother board connection (FIG. 12(*b*)).

Figure 13:
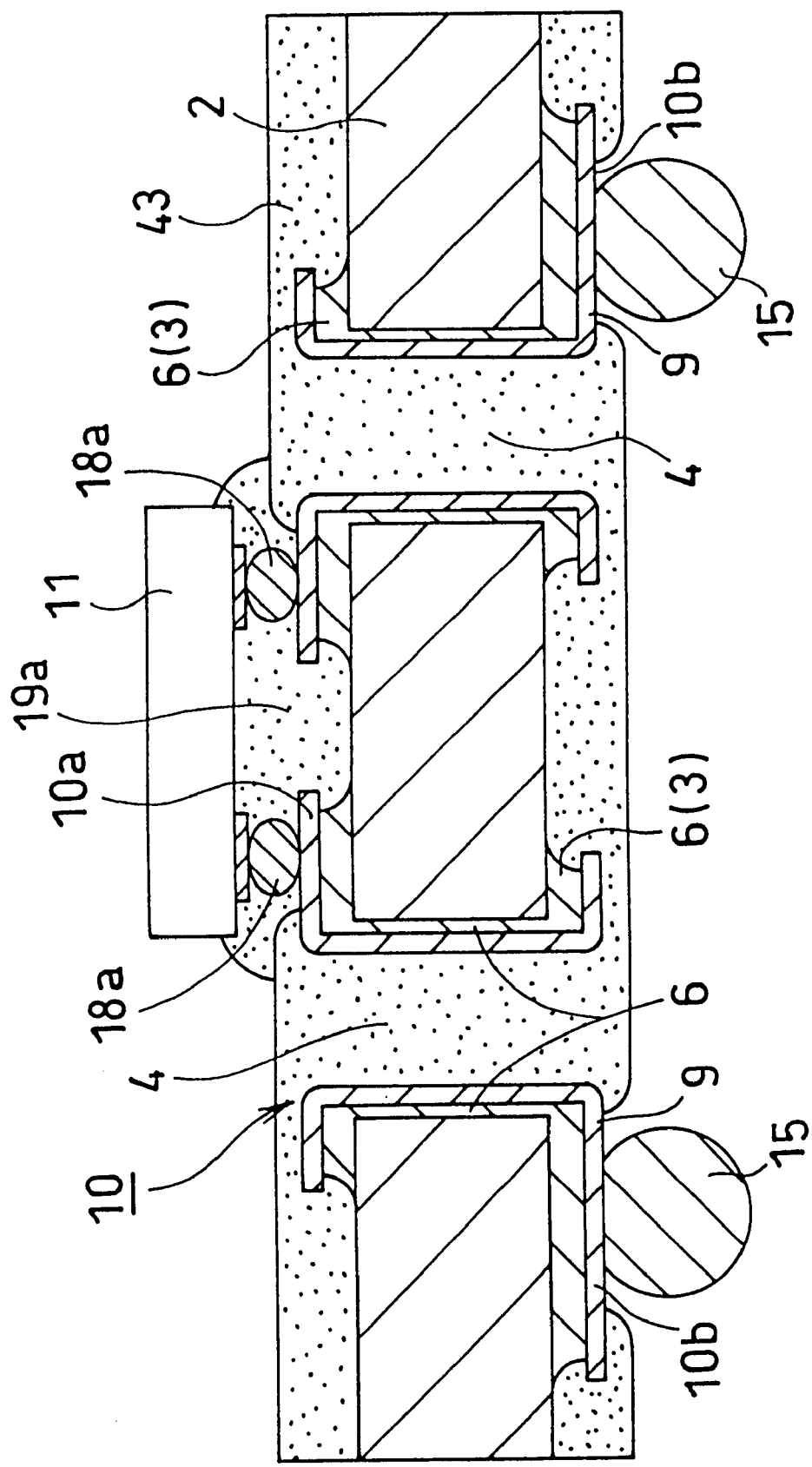
FIG. 13 is a sectional view showing an example of a flip chip package according to an embodiment.

An example of a flip chip package manufactured by the method described in FIGS. 10–12 is shown in FIG. 13. On the flip chip 11 mounting surface of the resin substrate 2, the interconnection pattern 10 including the ball pads 10*a* to which terminals of the flip chip 11 are connected is formed, while on the other surface, the ball pads 10*b* to which solder balls 15 for mother board connection are connected are formed. The interconnection pattern 10 (ball pads 10*a*) and the ball pads 10*b* are connected through the through holes 4 for interconnection, and on the ball pads 10*b*, the solder balls 15 are deposited. The interconnection pattern 10 is connected to the terminals of the flip chip 11 through solder balls 18*a* deposited on the ball pads 10*a*. A resin layer 19*a* is formed between the flip chip 11 and the resin substrate 2.

According to the embodiment (2), the copper foil 3 and Cu layer 6 of panel plating by electroless and electrolytic copper platings themselves function as conventional leads for electroplating 20(FIG. 2), so that the Ni/Au layer 9 can be formed by electroplating on the interconnection pattern 10 including the ball pads 10*a* and 10*b* without forming the leads for plating 20. Therefore, even when the electroplating technique is adopted, it is possible to make the interconnection pattern 10 have a higher density in the same manner as when the electroless plating technique is adopted. No reflection is caused by the partially remaining leads for plating 20, so that the electrical properties are not deteriorated. Furthermore, since the Ni/Au layer 9 is formed by electroplating, a sufficiently large value of adhesive strength of the solder balls 15 and 18*a* to the ball pads 10*a* and 10*b* can be obtained.

Since the Ni/Au layer 9 is also formed by electroplating on the side walls of the through holes 4, the reliability of the electrical connection through the through holes 4 is be improved.

The DFR 8 having a principal constituent of acrylic resin has high resistance to the Ni/Au plating solution, and is favorably stripped by a release solution such as a NaOH solution so that a residue of stripping is not caused. Therefore, it is easy to form the interconnection pattern 10 precisely, and so shorting between interconnections is not easily caused. Since the adhesiveness of the DFR 8 to the copper foil 3 can be made higher by the cleaning and bake treatment, the penetration of the plating solution under the DFR 8 can be certainly prevented.

Since the alkaline solution having a principal constituent of copper amine complex or tetraamminecopper (II) chloride is used as an etchant of the copper foil 3, only the copper foil 3 and Cu layer 6 of panel plating by electroless and electrolytic copper platings can be etched efficiently without dissolving the Ni/Au layer 9.

FIGS. 14–17 are diagrammatic sectional views showing part of the manufacturing process of a flip chip package according to the embodiment (3), and in the figures, reference numeral 1 represents a copper-covered laminate. The copper-covered laminate 1 comprises a resin substrate 2 and copper foils 3 adhered onto both main surfaces thereof (only one surface shown) (FIGS. 14(*a*) and 16(*a*)). Punching of through holes 4 is conducted on the copper-covered laminate 1 (FIG. 16(*a*)). In order to strip and remove the copper foils 3, etching treatment using a $FeCl_3$ solution is conducted. Then to make the deposition of electroless copper better in the subsequent electroless copper plating treatment, roughing treatment using a permanganic acid solution for surface roughing is conducted on the surfaces of the resin substrate 2 from which the copper foils 3 are removed (FIGS. 14(*b*) and 16(*b*)).

Panel plating treatment by electroless copper plating is conducted over all of both main surfaces of the resin substrate 2 including the side walls of the through holes 4 so that electroless copper plating layers 6*a* having a thickness of one tenth or so of the thickness of the copper foil 3 are formed. The electroless copper plating layers 6*a* formed on the top and bottom surfaces of the resin substrate 2 are electrically connected through the through holes 4 (FIGS. 14(*c*) and 16(*c*)).

Cleaning treatment is conducted on the surfaces of the electroless copper plating layers 6*a*. The cleaning treatment is conducted in order to increase the adhesiveness of a DFR 8 which is to be adhered thereto later, and in more concrete terms, jet scrubbing (mechanical polishing by buffing), acid cleaning with sulfuric acid, and jet scrubbing or the like are conducted. Onto the electroless copper plating layers 6a on which the cleaning treatment is conducted, the DFRs (Dry Film Resists) 8 having a principal constituent of acrylic resin are adhered. Exposure treatment wherein the inverse pattern of the interconnection pattern is developed is conducted on the DFRs 8, and PEB (Post Exposure Bake) treatment is conducted before developing in order to improve the adhesive strength by accelerating the optical setting reaction through the exposure. The DFRs 8 are developed so that the DFRs 8 of the inverse pattern are left, and post bake treatment is conducted in order to improve the adhesive strength by accelerating the thermosetting reaction (FIGS. 14(d) and 16(d)).

In order to form electrolytic copper plating layers 6b on the surfaces of the electroless copper plating layers 6a which are not covered with the DFRs 8, the resin is dipped into a plating solution, an electric current is applied thereto, and electroplating is conducted (FIGS. 15(a) and 17(a)). Then in order to form Ni/Au layers 9 by electroplating on the surfaces of the electrolytic copper plating layers 6b which are not covered with the DFRs 8, the resin substrate 2 is dipped into a plating solution, an electric current is applied thereto, and electroplating is conducted (FIGS. 15(b) and 17(b)). After rinsing the plating solution sufficiently, the substrate is dipped into an about 3% NaOH aqueous solution of 50° C. in order to strip and remove the DFRs 8. After removing the DFRs 8 (FIGS. 15(c) and 17(c)), etching is conducted on the electroless copper plating layers 6a using the formed Ni/Au layers 9 as a mask. As an etching solution, a solution which etches only the electroless copper plating layer 6a without etching the Ni/Au layer 9 is preferable. But since the electroless copper plating layer 6a can be made thinner by an order of magnitude or so than the copper foil 3, it can be etched even without using the alkaline solution having a principal constituent of copper ammine complex or tetraamminecopper (II) chloride used in the above embodiments (1) and (2). For example, a soft etching solution of such as sodium persulfate or mixture of hydrogen peroxide and sulfuric acid can be used as an etching solution. By the etching treatment, an interconnection pattern 30 including a pad portion wherein the electroplating film of the Ni/Au layer 9 is formed on the Cu interconnections made of the electroless copper plating layer 6a and the electrolytic copper plating layer 6b is formed (FIGS. 15(d) and 17(d)).

In the method for manufacturing a flip chip package according to the embodiment (3), the electroless copper plating layer 6a itself functions as conventional leads for plating 20, so that the Ni/Au layer 9 can be formed by electroplating on the interconnection pattern 30 without forming the leads for plating 20. Furthermore, since the electroless copper plating layer 6a can be made thinner by an order of magnitude or so than the copper foil 3, the etching treatment of the electroless copper plating layer 6a for pattern formation becomes extremely easy, and the quantity of overhang can be made almost zero (one tenth or so of the case wherein the copper foil 3 is used). As a result, it becomes further easier to make the interconnection pattern 30 have a higher density, compared with the embodiment (1) or (2). No reflection is caused by the partially remaining leads for plating 20, so that the electrical properties can be improved. Furthermore, since the Ni/Au layer 9 is formed by electroplating, a sufficiently large value of adhesive strength of wire bonding and solder balls 15 (FIG. 13) can be secured.

Since the Ni/Au layer 9 is also formed by electroplating on the side walls of the through holes 4, the reliability can be improved.

The DFR 8 having a principal constituent of acrylic resin has high resistance to the plating solutions used in the formation of the electrolytic copper plating layer 6b and Ni/Au layer 9, and is favorably stripped by a release solution such as a NaOH aqueous solution so that no residue of stripping is caused. Therefore, it is easy to form the interconnection pattern 30 precisely, and so shorting between interconnections is not easily caused. Since the adhesiveness of the DFR 8 to the electroless copper plating layer 6a can be made higher by the cleaning and bake treatment, the penetration of the plating solution under the DFR 8 can be certainly prevented.

Since the soft etching solution having a principal constituent of soda persulfate or mixture of hydrogen peroxide and sulfuric acid is used as an etchant of the electroless copper plating layer 6a, the electroless copper plating layer 6a can be etched efficiently without dissolving the Au layer and with only a small quantity of overhang of the electroless copper plating layer 6a. Moreover, the soft etching solution is easy to handle and the disposal of liquid waste is also easy.

FIGS. 18–21 are diagrammatic sectional views showing part of the manufacturing process of a flip chip package according to the embodiment (4), and in the figure, reference numeral 2 represents a resin substrate. Copper foils 3a which are considerably thinner (thickness of 1–3 μm or so) than the above copper foils 3 (thickness of ten-odd μm or so) are bonded by thermocompression onto both main surfaces of the resin substrate 2 in a prepreg state (only one surface shown) (FIGS. 18(a) and 20(a)). Punching of through holes 4 is conducted on the copper-covered laminate 1a (FIG. 20(b)). Then in order to make the deposition of electroless copper better in the subsequent electroless copper plating treatment, roughing treatment using a permanganic acid solution for surface roughing is conducted on the surfaces of the copper-covered laminate 1a (FIGS. 18(b) and 20(b)).

Panel plating treatment by electroless copper plating is conducted over all of both main surfaces of the copper-covered laminate 1a including the side walls of the through holes 4 so that electroless copper plating layers 6a having a thickness of one third or so of the thickness of the copper foil 3a are formed. The electroless copper plating layers 6a formed on the top and bottom surfaces of the copper-covered laminate 1a are electrically connected through the through holes 4 (FIGS. 18(c) and 20(c)).

Cleaning treatment is conducted on the surfaces of the electroless copper plating layers 6a. The cleaning treatment is conducted in order to increase the adhesiveness of a DFR 8, which is to be adhered thereto later, and in more concrete terms, jet scrubbing (mechanical polishing by buffing), acid cleaning with sulfuric acid, and jet scrubbing or the like are used. Onto the electroless copper plating layers 6a on which the cleaning treatment is conducted, the DFRs (Dry Film Resists) 8 having a principal constituent of acrylic resin are adhered. Exposure treatment wherein the inverse pattern of the interconnection pattern is developed is conducted on the DFRs 8, and PEB (Post Exposure Bake) treatment is conducted before developing in order to improve the adhesive strength by accelerating the optical setting reaction through the exposure. The DFRs 8 are developed so that the DFRs 8 of the inverse pattern are left, and post bake treatment is conducted in order to improve the adhesive strength by accelerating the thermosetting reaction (FIGS. 18(d) and 20(d)).

In order to form electrolytic copper plating layers 6b on the surfaces of the electroless copper plating layers 6a which are not covered with the DFRs 8, the resin substrate is dipped into a plating solution, an electric current is applied thereto, and electroplating is conducted (FIGS. 19(a) and 21(a)). Then in order to form Ni/Au layers 9 by electroplating on the surfaces of the electrolytic copper plating layers 6b which are not covered with the DFRs 8, the resin substrate 2 is dipped into a plating solution, an electric current is applied thereto, and electroplating is conducted (FIGS. 19(b) and 21(b)). After rinsing the plating solution sufficiently, the substrate is dipped into an about 3% NaOH aqueous solution of 50° C. in order to strip and remove the DFRs 8. After removing the DFRs 8 (FIGS. 19(c) and 21(c)), etching is conducted on the electroless copper plating layers 6a and copper foils 3a using the formed Ni/Au layers 9 as a mask. As an etching solution, a solution which etches the electroless copper plating layer 6a and copper foil 3a without etching the Au layer is preferable. But since the electroless copper plating layer 6a and copper foil 3a can be made thinner by an order of magnitude or so than the copper foil 3, it can be etched even without using the alkaline solution having a principal constituent of copper ammine complex or tetraamminecopper (II) chloride used in the above embodiments (1) and (2). For example, a soft etching solution of such as soda persulfate or mixture of hydrogen peroxide and sulfuric acid can be used as an etching solution. By the etching treatment, an interconnection pattern 30a including a pad portion wherein the electroplating film of the Ni/Au layer 9 is formed on the Cu interconnections made of the copper foil 3a, electroless copper plating layer 6a, and electrolytic copper plating layer 6b is formed (FIGS. 19(d) and 21(d)).

In the method for manufacturing a flip chip package according to the embodiment (4), the copper foil 3a and electroless copper plating layer 6a themselves function as conventional leads for plating 20, so that the Ni/Au layer 9 can be formed by electroplating on the interconnection pattern 30a without forming the leads for plating 20. Furthermore, since the copper foil 3a and electroless copper plating layer 6a are considerably thinner than the copper foil 3, the etching treatment of the copper foil 3a and electroless copper plating layer 6a for pattern formation becomes extremely easy, and the quantity of overhang can be made smaller (one fifth or so of the case wherein the copper foil 3 is used). As a result, it becomes easier to make the interconnection pattern 30a have a higher density, compared with the embodiment (1) or (2). No reflection is caused by the partially remaining leads for plating 20, so that the electrical properties can be improved. Furthermore, since the Ni/Au layer 9 is formed by electroplating, a sufficiently large value of adhesive strength of wire bonding and solder balls 15 (FIG. 13) can be secured. Since the Ni/Au layer 9 is also formed by electroplating on the side walls of the through holes 4, the reliability can be improved.

The DFR 8 having a principal constituent of acrylic resin has high resistance to the plating solutions used in the formation of the electrolytic copper plating layer 6b and Ni/Au layer 9, and is favorably stripped by a release solution such as a NaOH aqueous solution so that no residue of stripping is caused. Therefore, it is easy to form the interconnection pattern 30a precisely, and so shorting between interconnections is not easily caused. Since the adhesiveness of the DFR 8 to the electroless copper plating layer 6a can be made higher by the cleaning and bake treatment, the penetration of the plating solution under the DFR 8 can be certainly prevented.

Since the soft etching solution having a principal constituent of soda persulfate or mixture of hydrogen peroxide and sulfuric acid is used as an etchant of the copper foil 3a and electroless copper plating layer 6a, the copper foil 3a and electroless copper plating layer 6a can be etched efficiently without dissolving the Au layer and with only a small quantity of overhang of the copper foil 3a and electroless copper plating layer 6a. Moreover, the soft etching solution is easy to handle and the disposal of liquid waste is also easy. In the above embodiments (3) and (4), examples of the method for manufacturing a flip chip package is described, but the manufacturing method according to the present invention is not limited to the method for manufacturing a flip chip package. Since the Ni/Au layer 9 is formed by electroplating in the manufacturing method according to the present invention, the thickness of the Ni/Au layer 9 can be easily controlled unlike the case of electroless plating. By making the Ni/Au layer 9 thicker, the manufacturing method can be also applied to a method for manufacturing a BGA package of a wire bonding type in the same manner. In the above embodiment (3) the resin substrate 2 which is made by stripping and removing the copper foils 3 from the copper-covered laminate 1 is used, but in another embodiment, the copper-covered laminate 1 is not necessarily used, and the punching of the through holes 4 and the like can be conducted on a resin substrate 2 as a starting material. In the above embodiments (1)–(4), the DFR 8 is used as a plating mask, but the plating mask is not limited to the DFR 8. In another embodiment, a resist pattern can be formed using a liquid resist.

EXAMPLES

Examples of the chip package and the method for manufacturing the chip package according to the present invention are described below.

Example 1

Figure 8:
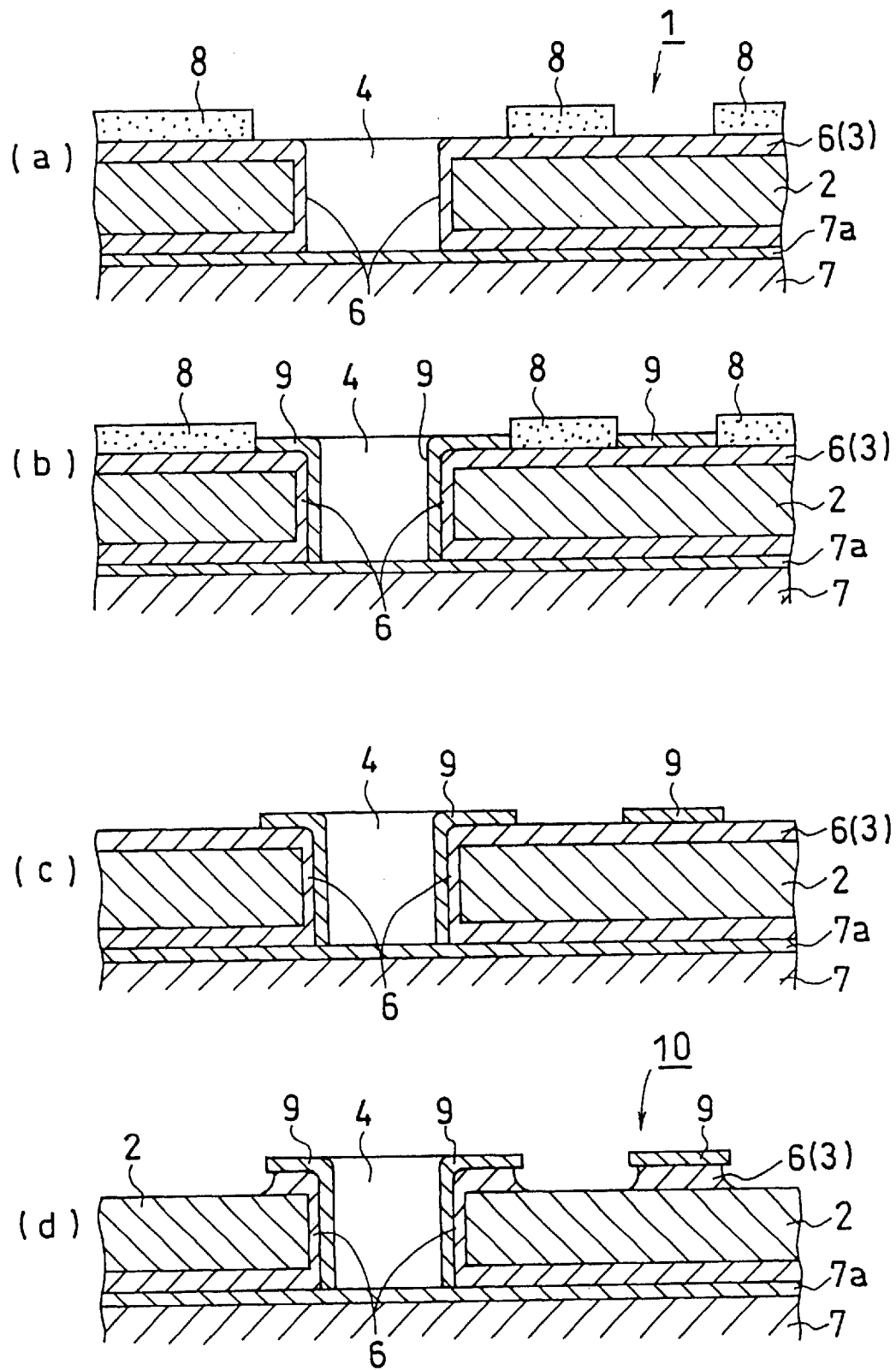
FIGS. 8(a)–(d) are sectional views showing part of the manufacturing process of a BGA package according to the embodiment (1) of the present invention.
Figure 9:
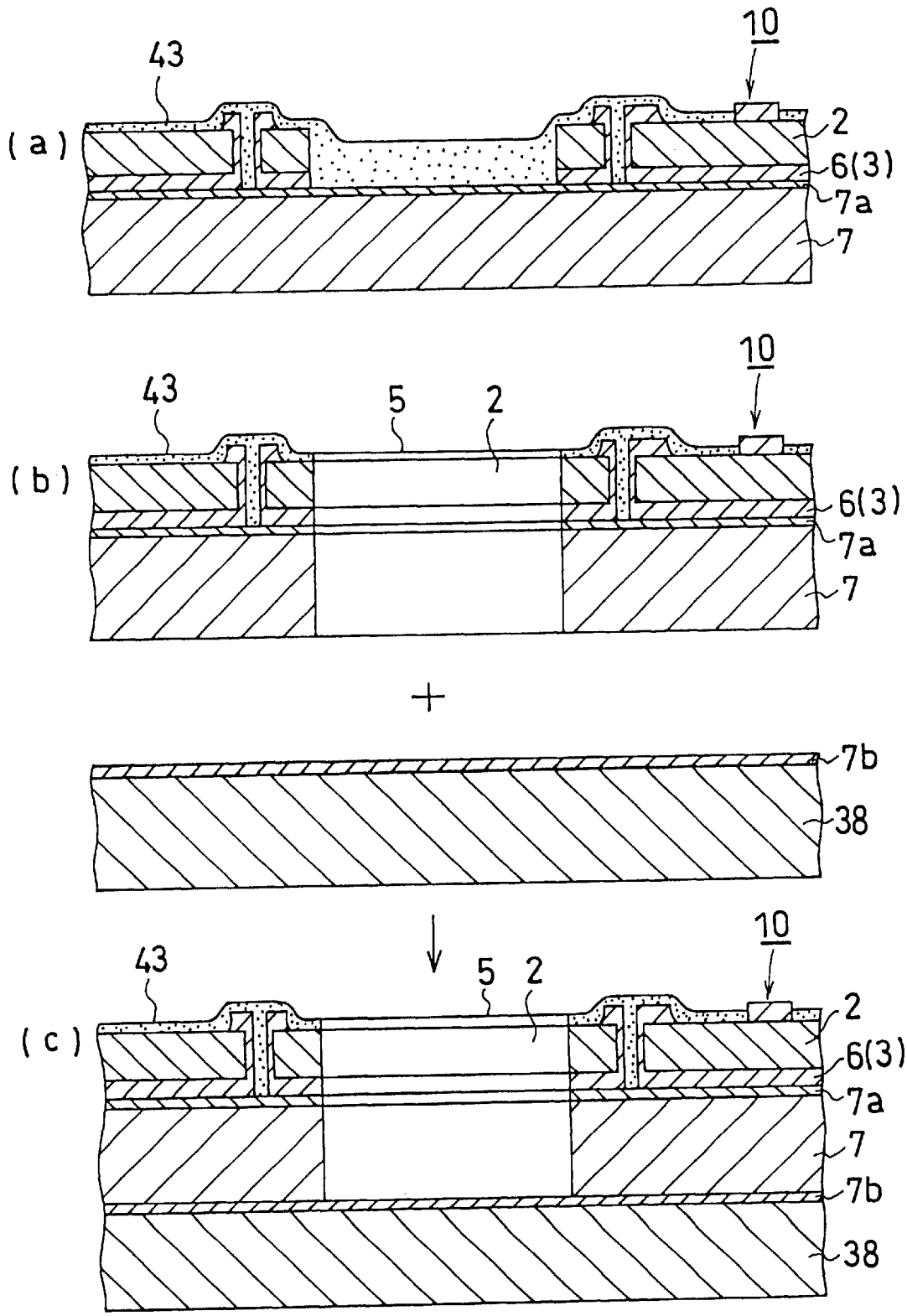
FIGS. 9(a)–(c) are sectional views showing part of the manufacturing process of a BGA package according to the embodiment (1) of the present invention.

A BGA with a heat spreader was manufactured by the method shown in FIGS. 7–9. The concrete manufacturing conditions were as follows.

Size of BT substrate: 500 mm×500 mm×thickness 0.1 mm

Thickness of copper foil 3: 12 μm

Diameter of through hole 4: 200 μm

Width of interconnection pattern 10: 90 μm

Diameter of ball pad: 400 μm

Chief material of DFR 8: acrylic resin

Constituents of Ni/Au plating solution: Nickel sulfate bath and gold cyanide bath Cleaning treatment on copper foil 3: buffing, jet scrubbing, and acid cleaning Bake treatment of DFR 8: 100° C., 30 min Release solution of DFR 8: 3% NaOH solution, 50° C.

Etchant of Cu: alkaline solution of pH 8.0–8.5 of copper ammine complex

On the ball pads, bonding pads, and through holes 4, the Ni/Au films 9 shown in FIG. 18 were formed.

Peel test of Ni/Au layer 9: by a peel test using a cellophane adhesive tape on the market, a preferable result, no peeling of the Ni/Au layer, could be obtained.

Example 2

A flip chip package shown in FIG. 13 was manufactured by the method shown in FIGS. 10–12. The concrete manufacturing conditions were as follows.

Material of resin substrate 2: BT (Bismaleimide Triazine)

Size of resin substrate 2: 500 mm×500 mm×thickness 100 μm

Thickness of copper foil 3: 12 μm

Diameter of through hole 4: 200 μm

Width of interconnection pattern 10: 90 μm

Diameter of ball pad 10a: 100 μm

Diameter of ball pad 10b: 400 μm

Chief material of DFR 8: acrylic resin

Constituents of Ni/Au plating solution: Nickel sulfate bath and gold cyanide bath Cleaning treatment on copper foil 3: buffing, jet scrubbing, and acid cleaning Bake treatment of DFR 8: 100° C. 30 min Release solution of DFR 8: 3% NaOH solution, 50° C.

Etchant of Cu: alkaline solution of pH 8.0–8.5 of copper ammine complex

Figure 19:
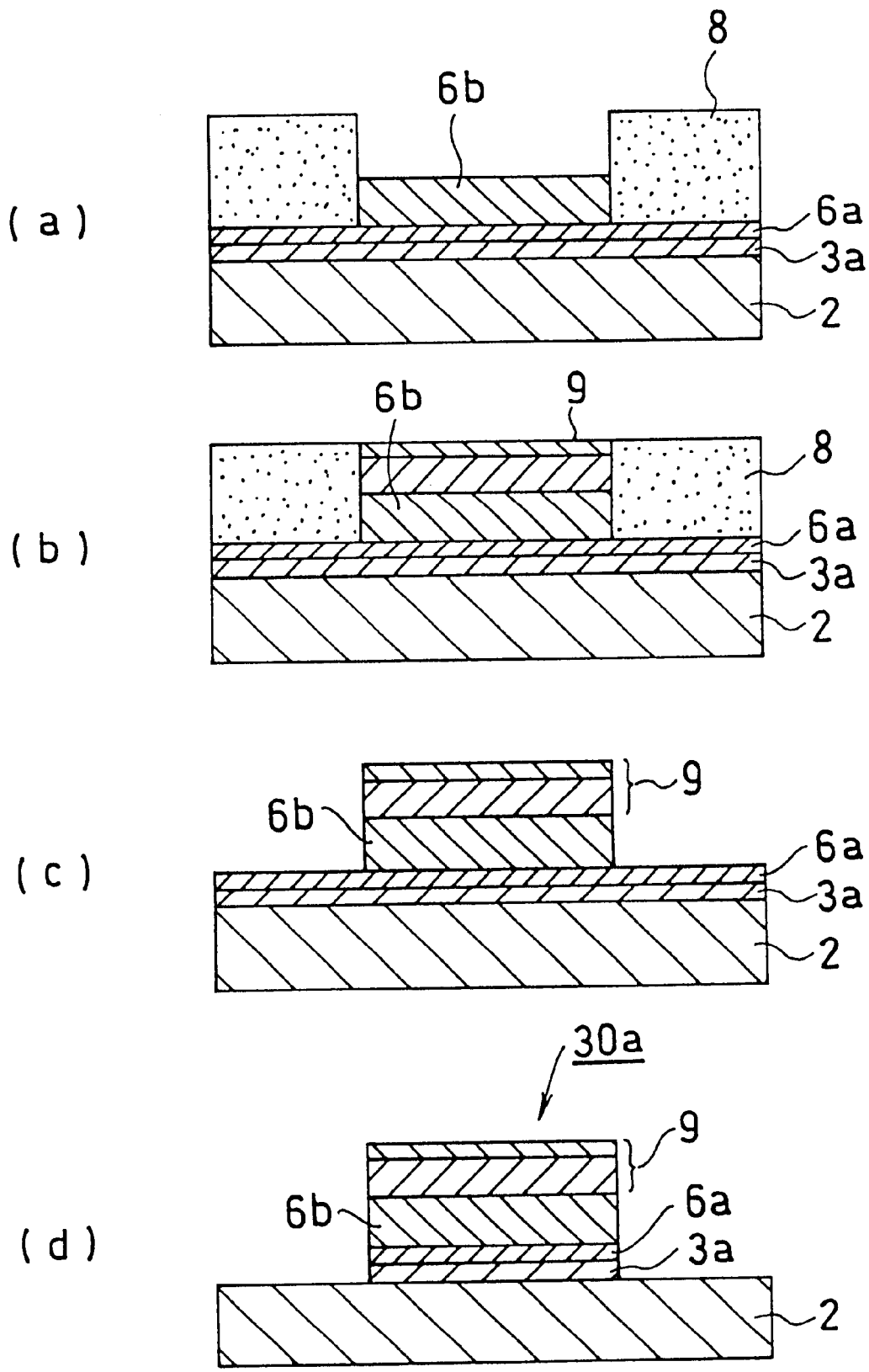
FIGS. 19(a)–(d) are sectional views showing part of the manufacturing process of a flip chip package according to the embodiment (4) of the present invention.
Figure 21:
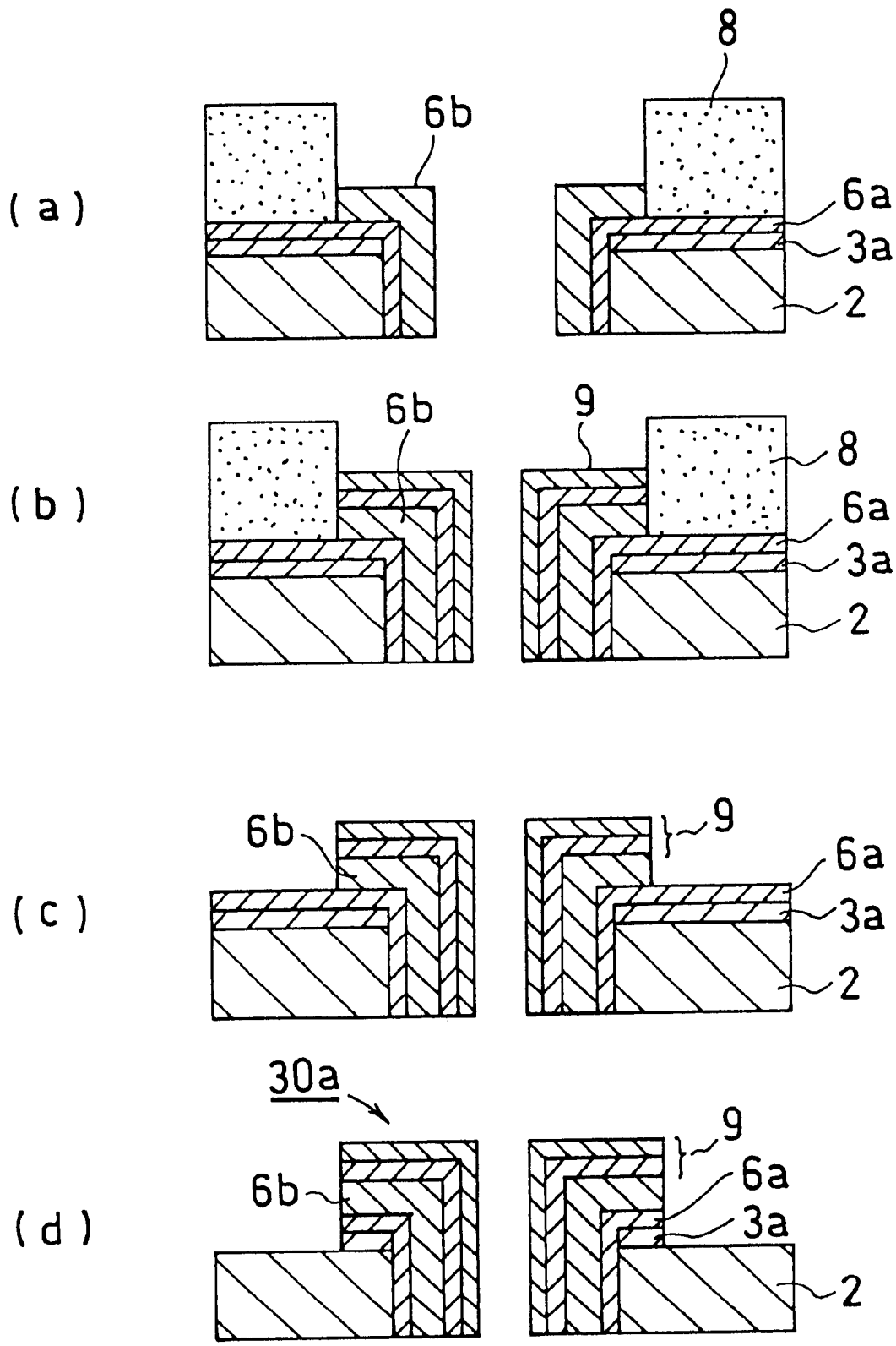
FIGS. 21(a)–(d) are sectional views showing part of the manufacturing process of a flip chip package according to the embodiment (4) of the present invention.
Figure 23:
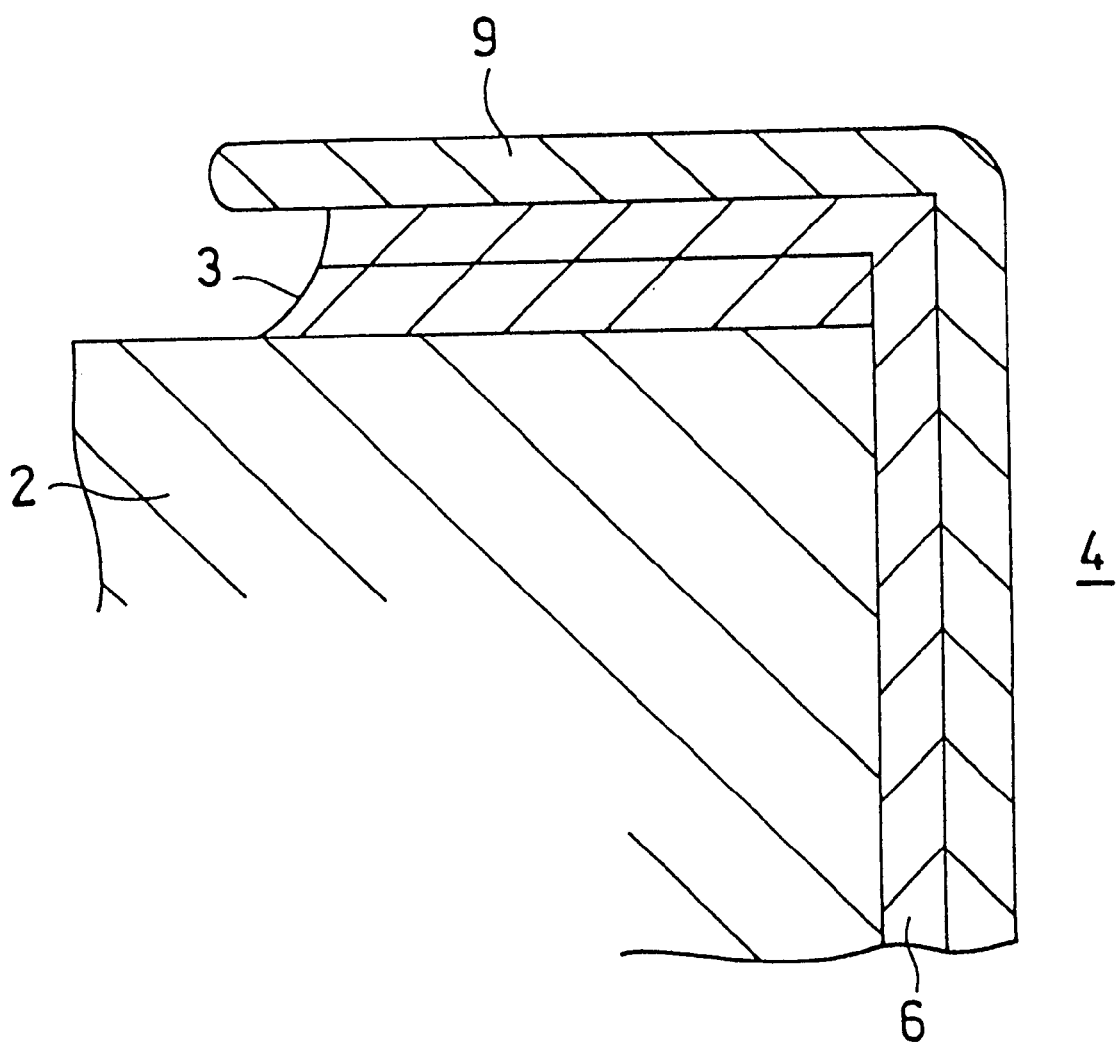
FIG. 23 is an enlarged sectional view showing a Ni/Au layer formed on a ball pad according to an example.

On the ball pads 10a and 10b and throughholes 4, the Ni/Au films 9 shown in FIG. 19 were formed.

Example 3

Figure 14:
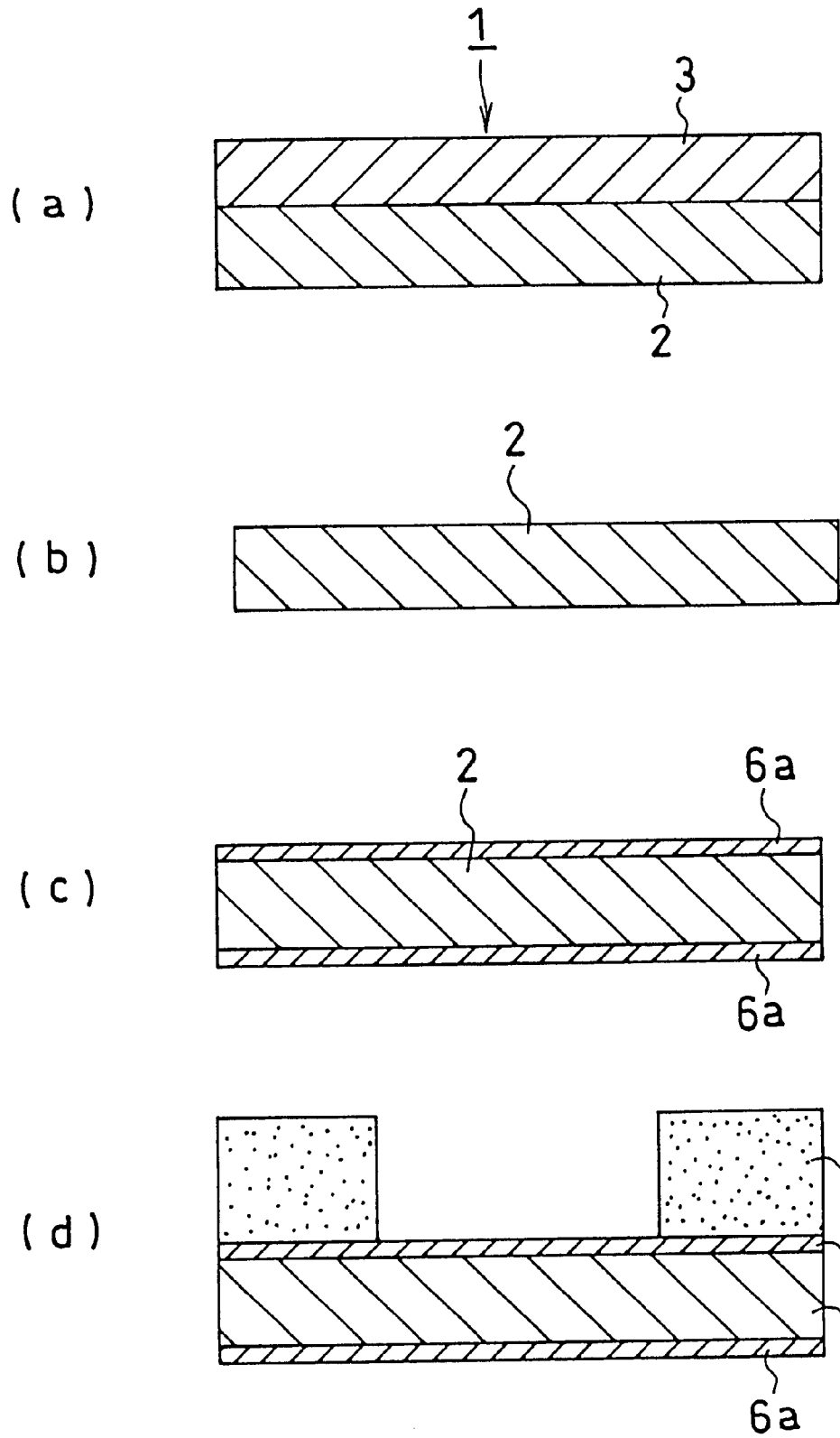
FIGS. 14(a)–(d) are sectional views showing part of the manufacturing process of a flip chip package according to the embodiment (3) of the present invention.
Figure 15:
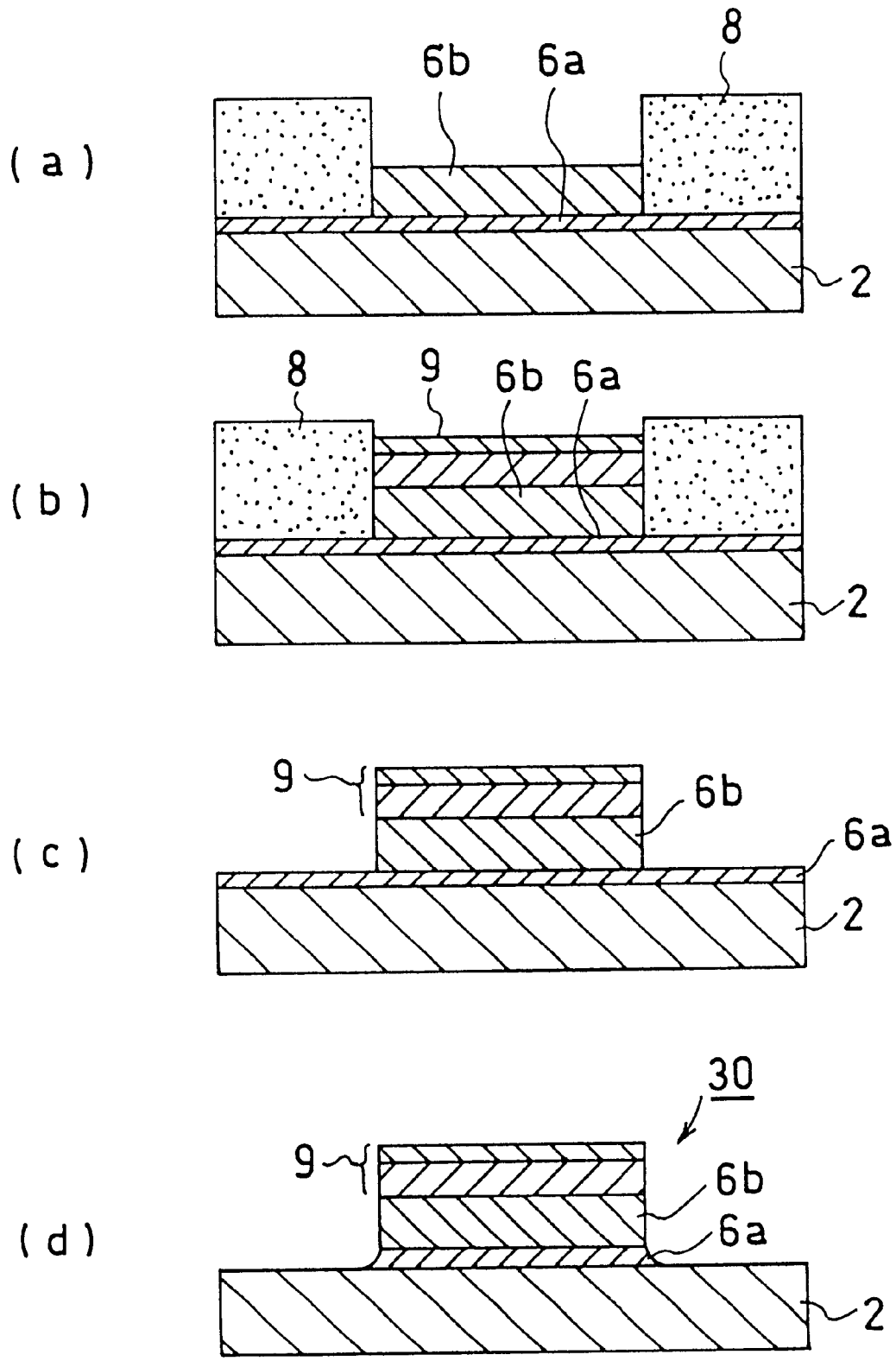
FIGS. 15(a)–(d) are sectional views showing part of the manufacturing process of a flip chip package according to the embodiment (3) of the present invention.
Figure 16:
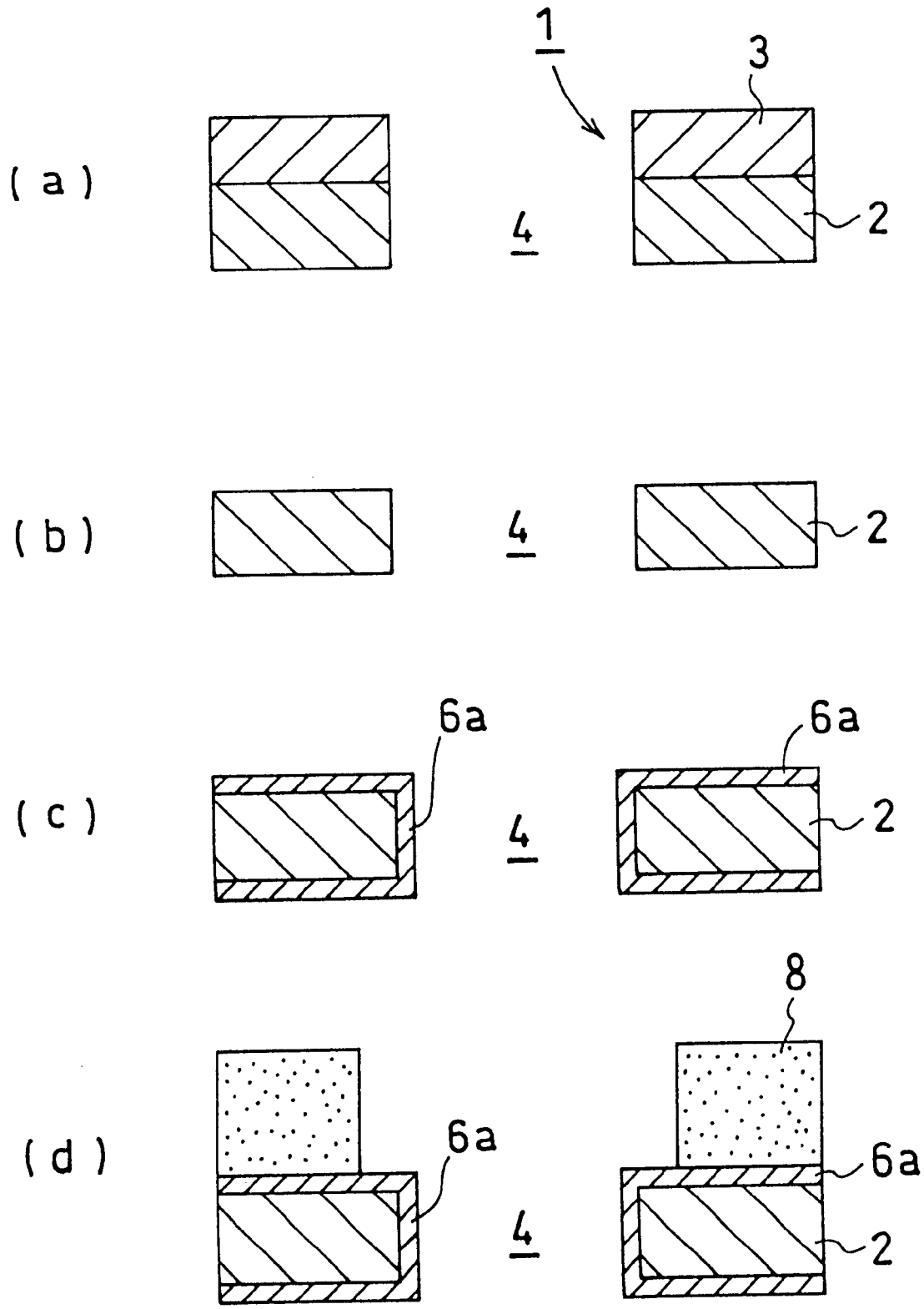
FIGS. 16(a)–(d) are sectional views showing part of the manufacturing process of a flip chip package according to the embodiment (3) of the present invention.
Figure 17:
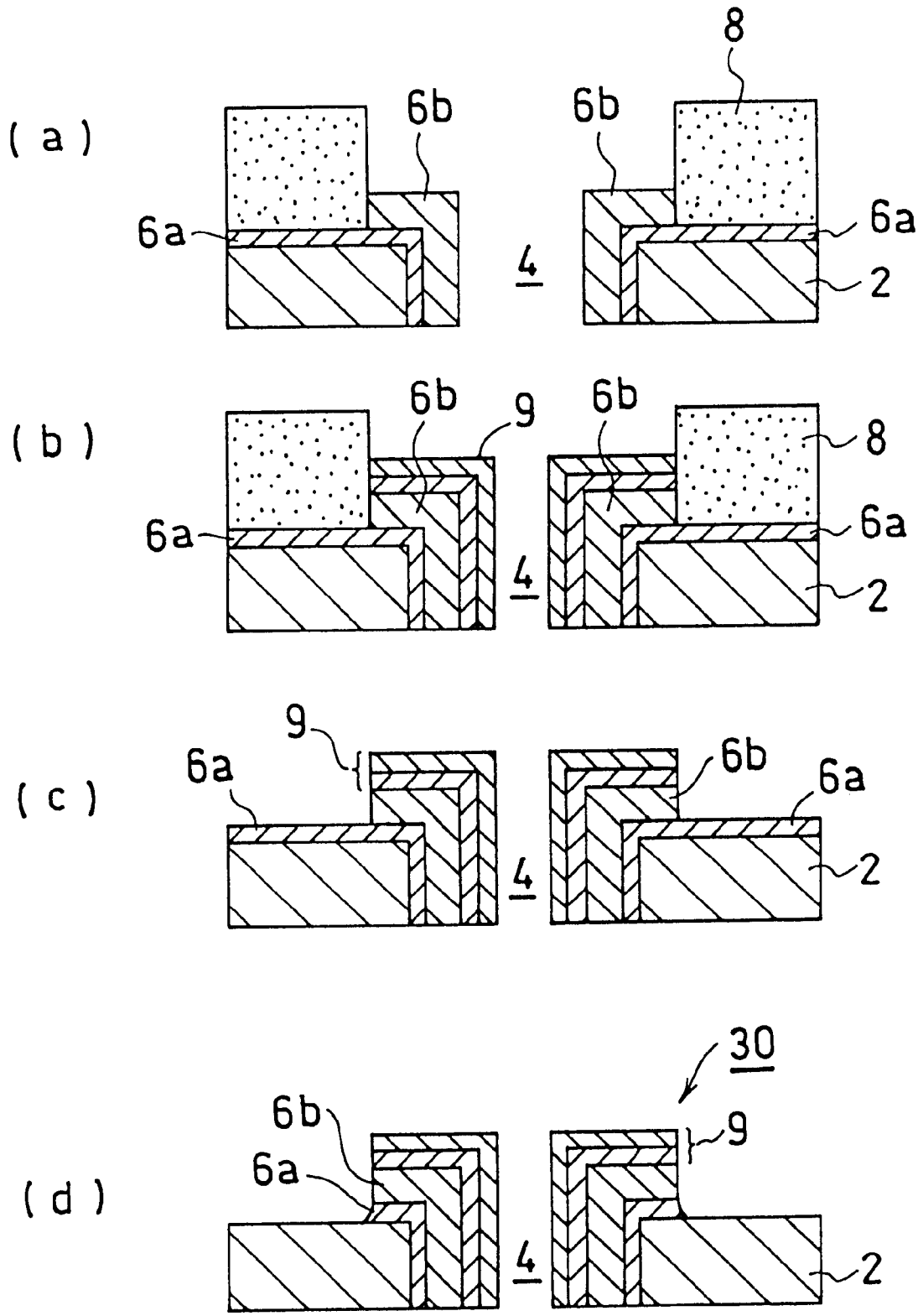
FIGS. 17(a)–(d) are sectional views showing part of the manufacturing process of a flip chip package according to the embodiment (3) of the present invention.

A flip chip package was manufactured by the method shown in FIGS. 14–16. The concrete manufacturing conditions were as follows.

Material of resin substrate 2: BT (Bismaleimide Triazine)

Size of resin substrate 2: 500 mm×500 mm×thickness 100 μm

Thickness of electroless copper plating layer 6a:1 μm

Diameter of through hole 4: 100 μm

Width of interconnection pattern 10: 40 μm

Diameter of ball pad 10a: 50 μm

Diameter of ball pad 10b: 100 μm

Chief material of DFR 8: acrylic resin

Constituents of Ni/Au plating solution: Nickel sulfate bath and gold cyanide bath Cleaning treatment on electroless: buffing, jet scrubbing, and acid copper plating layer 6a cleaning Bake treatment of DFR 8: 100° C., 30 min Release solution of DFR 8: 3% NaOH solution, 50° C.

Etchant of Cu: soft etching solution of pH 7.0 of soda persulfate

Figure 24:
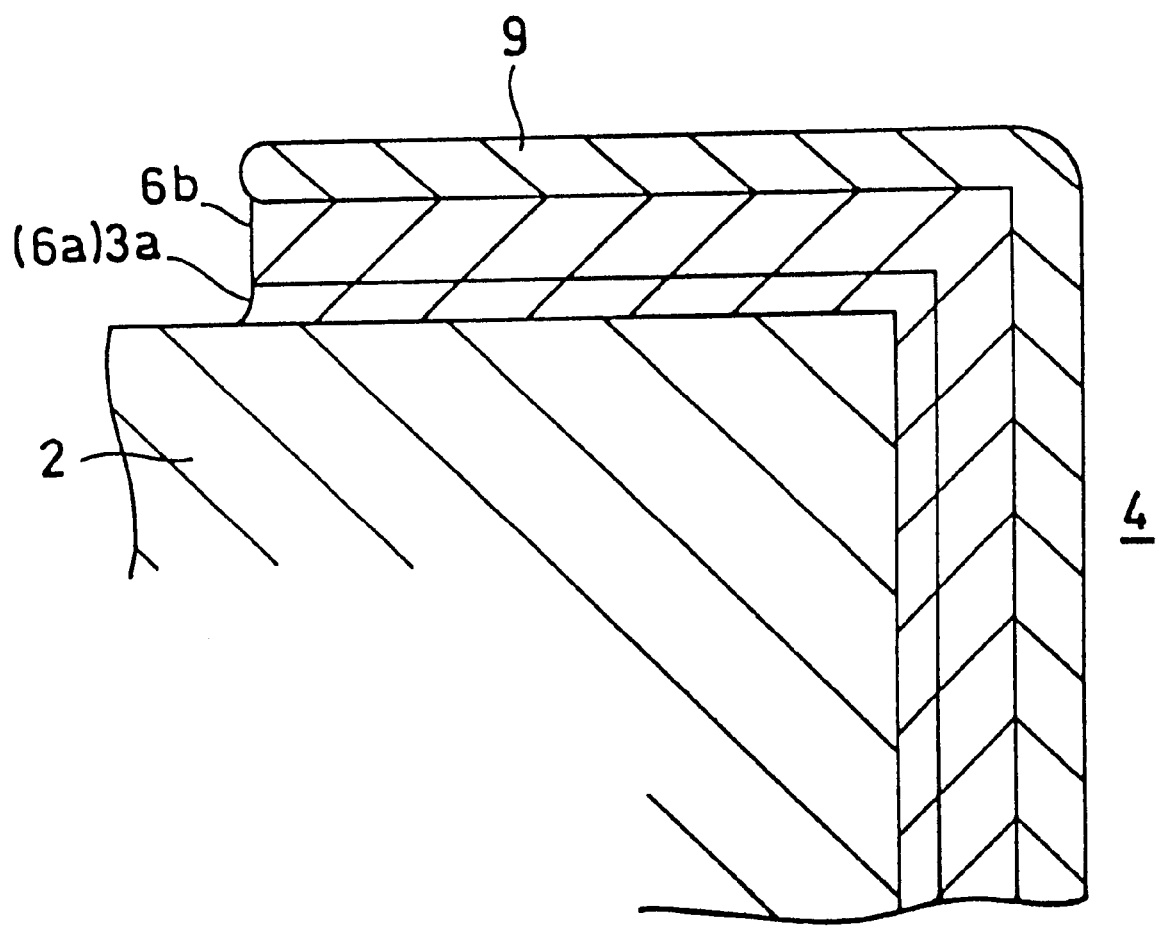
FIG. 24 is an enlarged sectional view showing a Ni/Au layer formed on a ball pad according to an example.

On the ball pads and through holes 4, the Ni/Au films 9 shown in FIG. 24 were formed.

Peel test of Ni/Au layer 9: by a peel test using a cellophane adhesive tape on the market, a preferable result, no peeling of the Ni/Au layer, could be obtained.

Example 4

A flip chip package was manufactured by the method shown in FIGS. 18–21. The concrete manufacturing conditions were as follows.

Material of resin substrate 2: BT (Bismaleimide Triazine)

Size of resin substrate 2: 500 mm×500 mm×thickness 100 μm

Thickness of copper foil 3a: 3 μm

Thickness of electroless copper plating layer 6a: 1 μm

Diameter of through hole 4: 100 μm

Width of interconnection pattern 10: 40 μm

Diameter of ball pad 10a: 50 μm

Diameter of ball pad 10b: 100 μm

Chief material of DFR 8: acrylic resin

Constituents of Ni/Au plating solution: Nickel sulfate bath and gold cyanide bath Cleaning treatment on electroless: buffing, jet scrubbing, and acid cleaning copper plating layer 6a Bake treatment of DFR 8: 100° C., 30 min Release solution of DFR 8: 3% NaOH solution, 50° C.

Etchant of Cu: soft etching solution of pH 7.0 of soda persulfate

On the ball pads and through holes 4, the Ni/Au films 9 shown in FIG. 24 were formed.

Peel test of Ni/Au layer 9: by a peel test using a cellophane adhesive tape on the market, a preferable result, no peeling of the Ni/Au layer, could be obtained.

What is claimed is:

1. A method for manufacturing a chip package, including the steps of:

forming a plating resist pattern inverse to an interconnection pattern on the surface of a metal layer, which comprises a copper foil, an electroless copper plating layer, and an electrolytic plating layer, formed on one side or both sides of a resin substrate;

applying an electric current to the metal layer so as to form Ni and Au films by electroplating on the metal layer surface which is not covered with the plating resist pattern; and removing the plating resist pattern so as to etch the metal layer using the Ni/Au films as an etching mask.

2. The method for manufacturing a chip package according to claim 1, wherein the metal layer which comprises an electroless copper plating layer, or a copper foil and an electroless copper plating layer, and the step of applying an electric current to the metal layer so as to form a copper film by electroplating on the metal layer surface which is not covered with the plating resist pattern is put between the step of forming the plating resist pattern inverse to the interconnection pattern and the step of forming Ni and Au films by electroplating.

3. The method for manufacturing a chip package according to claim 2, wherein a soft etching solution having a principal constituent of sodium persulfate or mixture of hydrogen peroxide and sulfuric acid is used as an etchant of the metal layer.

4. The method for manufacturing a chip package according to claim 1 or claim 2 including the step of conducting electroless plating and electroplating treatment of copper on the side walls of through holes after forming the through holes in the resin substrate.

5. The method for manufacturing a chip package according to claim 1 or claim 2, wherein a dry film resist having a principal constituent of acrylic resin is used for forming the plating resist pattern inverse to the interconnection pattern.

6. The method for manufacturing a chip package according to claim 5, wherein a cleaning treatment is conducted on the metal layer surface before forming the plating resist pattern inverse to the interconnection pattern.

7. The method for manufacturing a chip package according to claim 1 or claim 2, wherein a liquid resist having a principal constituent of acrylic resin is used for forming the plating resist pattern inverse to the interconnection pattern.

8. The method for manufacturing a chip package according to claim 1 or claim 2, wherein a baking treatment is conducted on the plating resist and/or the plating resist pattern inverse to the interconnection pattern before forming Ni and Au films.

9. The method for manufacturing a chip package according to claim 1, wherein an alkaline solution having a principal constituent of copper amine complex or tetraaminecopper (II) chloride is used as an etchant of the metal layer.

* * * * *